(12) United States Patent
Watanabe

(10) Patent No.: US 10,782,003 B2
(45) Date of Patent: Sep. 22, 2020

(54) LED SUBSTRATE AND LIGHT ILLUMINATING APPARATUS WITH THE SAME

(71) Applicant: HOYA CANDEO OPTRONICS CORPORATION, Toda-shi, Saitama (JP)

(72) Inventor: Hiroaki Watanabe, Toda (JP)

(73) Assignee: HOYA CANDEO OPTRONICS CORPORATION, Toda-Shi, Saitama (JP)

( * ) Notice: Subject to any disclaimer, the term of this patent is extended or adjusted under 35 U.S.C. 154(b) by 473 days.

(21) Appl. No.: 15/464,707

(22) Filed: Mar. 21, 2017

(65) Prior Publication Data
US 2017/0284642 A1     Oct. 5, 2017

(30) Foreign Application Priority Data
Mar. 31, 2016    (JP) .................................. 2016-073751

(51) Int. Cl.
     *F21V 29/76*        (2015.01)
     *H01L 33/62*        (2010.01)
     (Continued)

(52) U.S. Cl.
    CPC .......... *F21V 19/0025* (2013.01); *F21V 17/10* (2013.01); *F21V 23/06* (2013.01);
                         (Continued)

(58) Field of Classification Search
    CPC ...... F21V 19/0025; F21V 29/76; F21V 17/10; F21V 23/06; F21Y 2103/10;
                        (Continued)

(56) References Cited

U.S. PATENT DOCUMENTS

| 4,845,405 A | * | 7/1989 | Yamane | .................... | G09F 9/33 |
| | | | | | 313/500 |
| 7,259,403 B2 | * | 8/2007 | Shimizu | .................... | F21L 4/00 |
| | | | | | 257/99 |

(Continued)

FOREIGN PATENT DOCUMENTS

| CN | 102374401 A | 3/2012 |
| EP | 2442362 A1 | 4/2012 |

(Continued)

*Primary Examiner* — Henry Luong
(74) *Attorney, Agent, or Firm* — Rabin & Berdo, P.C.

(57) ABSTRACT

Provided is a light emitting diode (LED) substrate. The LED substrate includes a substrate of a rectangular shape having sides in a first direction and a second direction, a plurality of LED devices placed on a surface of the substrate, and a plurality of conducting member which electrically connects the plurality of LED devices on the surface of the substrate and forms 2n circuits independent from each other in the first direction. Each circuit has a first electrode part and a second electrode part. The first electrode part receives input of an electric current from the outside, the second electrode part outputs an electric current to the outside, and the first electrode part and the second electrode part face each other in the second direction, and are alternately placed in the first direction to be point-symmetrical with respect to a center of the substrate as a symmetry point.

18 Claims, 21 Drawing Sheets

(51) Int. Cl.
*F21V 19/00* (2006.01)
*F21V 17/10* (2006.01)
*F21V 23/06* (2006.01)
*H01L 25/075* (2006.01)
*F21Y 103/10* (2016.01)
*F21Y 115/10* (2016.01)

(52) U.S. Cl.
CPC .......... *F21V 29/76* (2015.01); *H01L 25/0753* (2013.01); *H01L 33/62* (2013.01); *F21Y 2103/10* (2016.08); *F21Y 2115/10* (2016.08)

(58) Field of Classification Search
CPC ............... F21Y 2115/10; H01L 25/075; H01L 25/0753; H01L 33/62; H01L 27/156
See application file for complete search history.

(56) References Cited

U.S. PATENT DOCUMENTS

| | | | |
|---|---|---|---|
| 2008/0179602 A1 | 7/2008 | Negley et al. | |
| 2009/0316409 A1* | 12/2009 | Kim | H05K 1/0295 362/249.14 |
| 2012/0091476 A1* | 4/2012 | Su | H01L 25/0753 257/88 |
| 2013/0087722 A1 | 4/2013 | Brown | |
| 2016/0329473 A1 | 11/2016 | Lee et al. | |
| 2017/0092628 A1 | 3/2017 | Lee et al. | |

FOREIGN PATENT DOCUMENTS

| | | |
|---|---|---|
| JP | 2006-228557 A | 8/2006 |
| JP | 2006-295084 A | 10/2006 |
| JP | 2009-147082 A | 7/2009 |
| JP | 2009-534792 A | 9/2009 |
| JP | 2014-528171 A | 10/2014 |
| JP | 2015-053160 A | 3/2015 |
| JP | 2015-153771 A | 8/2015 |
| WO | WO 2008-091837 A2 | 7/2008 |
| WO | WO 2013-040453 A2 | 3/2013 |
| WO | WO 2014-207620 A1 | 12/2014 |

* cited by examiner

LED SUBSTRATE AND LIGHT ILLUMINATING APPARATUS WITH THE SAME

TECHNICAL FIELD

The present disclosure relates to a light emitting diode (LED) substrate having a plurality of LED chips mounted thereon and a light illuminating apparatus with the LED substrate.

BACKGROUND ART

Conventionally, an ultraviolet (UV) curable ink that is cured by radiation of UV light was used as an ink for sheet-fed offset printing. Furthermore, a UV curable resin was used as an adhesive around Flat Panel Display (FPD) such as a liquid crystal panel or an organic Electro Luminescence (EL) panel. To cure the UV curable ink or UV curable resin, generally, a UV light illuminating apparatus that irradiates UV light is used, and in particular, there is a need to illuminate over a wide-range irradiation area for sheet-fed offset printing or FPD applications, so a UV light illuminating apparatus that irradiates light of a line shape is used.

As the UV light illuminating apparatus, a lamp-type illuminating apparatus using a high pressure mercury lamp or a mercury xenon lamp as a light source has been long known, but recently, in keeping with the demand for reduced power consumption, a longer service life, and a compact device, a UV light illuminating apparatus using LED as an alternative to a traditional discharge lamp for a light source is developed.

The UV light illuminating apparatus which uses LED as a light source and irradiates UV light of a line shape is disclosed by, for example, Patent Literature 1, and has a plurality of substrates arranged in the shape of a straight line, each substrate having a plurality of light emitting devices (LEDs) mounted thereon, to obtain UV light of a line shape.

Furthermore, in the UV light illuminating apparatus having the arrangement of a plurality of substrates, when the LED is out of order or needs maintenance, it is necessary to replace or examine the substrate, and thus it is desirable to allow the substrate to be easily removed. To easily remove the substrate, a well-known approach is, for example, to arrange a plurality of LED assemblies with positive and negative electrodes disposed in alternating manner and connect adjacent pairs of positive and negative electrodes by interconnect clamps as described in Patent Literature 2.

RELATED LITERATURES

Patent Literatures (Patent Literature 1) Japanese Patent Publication No. 2015-153771

(Patent Literature 2) Japanese Patent Publication No. 2014-528171

DISCLOSURE

Technical Problem

SUMMARY OF THE INVENTION

Problem to be Solved by the Invention

However, in the design disclosed by Patent Literature 2, because the LED assemblies have polarity (i.e., having directionality), unless the LED assemblies are arranged and connected in an accurate direction, a LED chip may be broken, and accordingly, an extremely prudent operation is required to replace the LED assembly.

Furthermore, in the design disclosed by Patent Literature 2, because all the LED assemblies connected by the interconnect clamps are connected in series, with the increasing number of LED assemblies connected, the required source voltage rises, making it difficult to increase the number of LED assemblies (i.e., increase the intensity of illumination).

In view of these circumstances, the present disclosure is directed to providing a LED substrate that has a plurality of LEDs, while having no directionality, then is easy to replace, and a light illuminating apparatus with the LED substrate.

Technical Solution

To achieve the object, a light emitting diode (LED) substrate of the present disclosure includes a substrate of a rectangular shape having sides in a first direction and a second direction perpendicular to the first direction, a plurality of LED devices placed on a surface of the substrate, and a plurality of conducting member which electrically connects the plurality of LED devices on the surface of the substrate and forms 2n circuits independent from each other in the first direction, wherein n is an integer greater than or equal to 1, and each circuit has a first electrode part on the conducting member connected to one end of the circuit and a second electrode part on the conducting member connected to the other end of the circuit, the first electrode part being electrically connected to outside to receive input of an electric current from the outside, the second electrode part being electrically connected to outside to output an electric current to the outside, and the first electrode part and the second electrode part face each other in the second direction, and are alternately placed in the first direction such that the first electrode part and the second electrode part are point-symmetrical with respect to a center of the substrate as a symmetry point.

By this construction, because the first electrode part and the second electrode part are placed at the position of point-symmetry with respect to the center of the substrate, the substrate has no directionality, removing the concerns about polarity, for example, when replacing the substrate.

Furthermore, each circuit preferably comprises a parallel circuit in which some of the plurality of LED devices are connected in parallel. Furthermore, in this case, the plurality of LED devices may be placed in a line shape along the first direction.

Furthermore, each circuit preferably comprises a plurality of parallel circuits in which some of the plurality of LED devices are connected in parallel, and a series circuit in which the plurality of parallel circuits is connected in series. Furthermore, in this case, the plurality of LED devices may be placed in multi-line shape along the first direction.

Furthermore, in another aspect, a light illuminating apparatus of the present disclosure may include at least one LED substrate described above.

Furthermore, in the light illuminating apparatus, the LED substrate may be placed in M numbers along the second direction wherein M is an integer greater than or equal to 2, and when $1^{st}$ to $M^{th}$ LED substrates are set in a sequential order along the second direction and $1^{st}$ to $2n^{th}$ circuits are set in a sequential order along the first direction, the light illuminating apparatus may include a connecting member placed between the second electrode and the first electrode facing each other between the $i^{th}$ LED substrate and the $i+1^{th}$ LED substrate and between the first electrode and the second electrode to electrically connect them, wherein i is an integer greater than or equal to 1 and less than or equal to M−1, a first power supply member connected to the first electrode of the $2j-1^{th}$ circuit formed in the $1^{st}$ LED substrate and the $2j^{th}$ circuit formed in the $M^{th}$ LED substrate to supply an electric current to the first electrode, wherein j is an integer greater than or equal to 1 and less than or equal to n, and a second power supply member connected to the second electrode of the $2j-1^{th}$ circuit formed in the $M^{th}$ LED substrate and the $2j^{th}$ circuit formed in the $1^{st}$ LED substrate to output an electric current from the second electrode. Furthermore, in this case, the connecting member, the first power supply member, and the second power supply member may serve as a fixing part for fixing the LED substrate.

Furthermore, in the light illuminating apparatus, the LED substrate may be placed in M numbers along the second direction wherein M is an integer greater than or equal to 2, and when $1^{st}$ to $M^{th}$ LED substrates are set in a sequential order along the second direction and $1^{st}$ to $2n^{th}$ circuits are set in a sequential order along the first direction, the light illuminating apparatus may include a first connecting member placed between the second electrode and the first electrode facing each other between the $i^{th}$ LED substrate and the $i+1^{th}$ LED substrate and between the first electrode and the second electrode to electrically connect them, wherein i is an integer greater than or equal to 1 and less than or equal to M−1, a second connecting member placed between the second electrode of the $2j-1^{th}$ circuit and the first electrode of the $2j+1^{th}$ circuit formed in the $M^{th}$ LED substrate to electrically connect them, wherein j is an integer greater than or equal to 1 and less than or equal to n, a first power supply member connected to the first electrode of the $2j-1^{th}$ circuit formed in the $1^{st}$ LED substrate to supply an electric current to the first electrode, and a second power supply member connected to the second electrode of the $2j^{th}$ circuit formed in the $1^{st}$ LED substrate to output an electric current from the second electrode. Furthermore, in this case, the first connecting member, the second connecting member, the first power supply member, and the second power supply member may serve as a fixing part for fixing the LED substrate.

Furthermore, in the light illuminating apparatus, the LED substrate may be placed in N numbers along the first direction wherein N is an integer greater than or equal to 2, and when $1^{st}$ to $N^{th}$ LED substrates are set in a sequential order along the first direction and $1^{st}$ to $2n^{th}$ circuits are set in a sequential order along the first direction, the light illuminating apparatus may include a connecting member placed between the second electrode of the $j^{th}$ circuit and the first electrode of the $j+1^{th}$ circuit formed in the $i^{th}$ LED substrate and between the second electrode of the $2n^{th}$ circuit formed in the $i^{th}$ LED substrate and the first electrode of the $1^{st}$ circuit formed in the $i+1^{th}$ LED substrate to electrically connect them, wherein i is an integer greater than or equal to 1 and less than or equal to N−1 and j is an integer greater than or equal to 1 and less than or equal to 2n−1, a first power supply member connected to the first electrode of the $1^{st}$ circuit formed in the $1^{st}$ LED substrate to supply an electric current to the first electrode, and a second power supply member connected to the second electrode of the $2n^{th}$ circuit formed in the $N^{th}$ LED substrate to output an electric current from the second electrode. Furthermore, in this case, the connecting member, the first power supply member, and the second power supply member may serve as a fixing part for fixing the LED substrate.

Advantageous Effects

As hereinabove described, according to the present disclosure, a LED substrate that has a plurality of LEDs, while having no directionality, then is easy to replace is realized. Furthermore, a light illuminating apparatus with the LED substrate provides outstanding maintenance.

DETAILED DESCRIPTION OF MAIN ELEMENTS

Figure 1A:
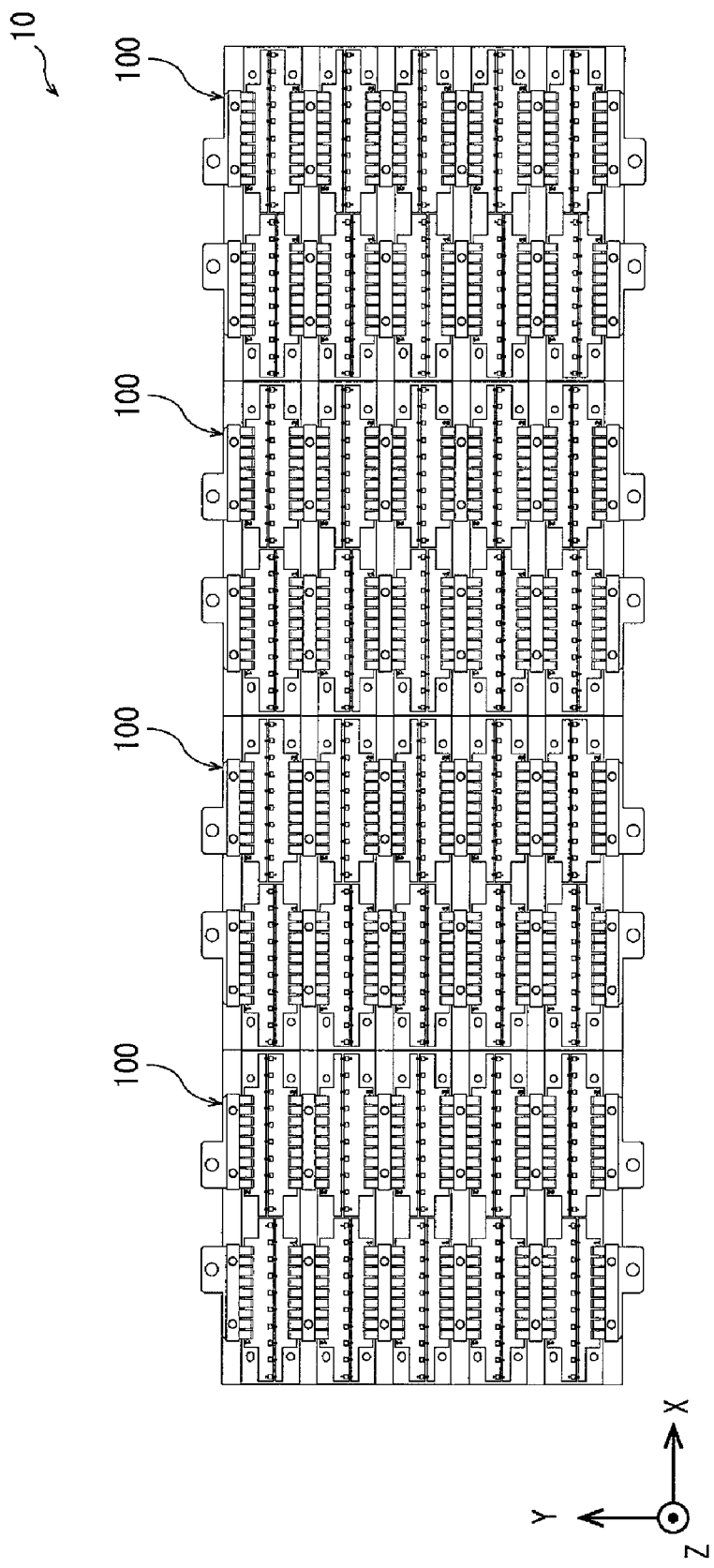
FIGS. 1A, 1B and 1C are diagrams of outward appearance schematically illustrating the construction of a light illuminating apparatus according to an embodiment of the present disclosure.

10: Light illuminating apparatus
100, 100A, 100B, 100C, 100D, 100E, 100F, 100G, 100H, 100I: LED unit
110, 110M: Base plate
114a, 114b, 114c, 114d, 114e: Mounting surface
116: Cylindrical boss
120, 120a, 120b, 120c, 120d, 120e, 120Ma, 120Mb, 120Na, 120Nb: LED substrate module
121, 121M, 121N: Substrate
121Na, 121Nb, 121Nc, 121Nd, 121Nx: Through-hole
122a, 123a: Anode pattern
122ap, 122bp, 123ap, 123bp: Terminal area
122b, 123b: Cathode pattern
125: LED device
130: Power supply member
132, 134, 132G, 134G: End power supply terminal
132a, 134a: Conducting part
132b, 134b: Fixing part
132c, 134c: Through-hole
132ab, 134ab: Contact point part
132ba, 134ba: Through-hole
132aa: Anode plate
134aa: Cathode plate
136, 136G: Intermediate power supply terminal
136a: Conducting part
136aa, 136ab: Contact point part
136b: Fixing part
136ba: Through-hole
138: Short bar
135, 139: End power supply terminal

BEST MODE

Mode for Carrying Out the Invention

Hereinafter, the embodiments of the present disclosure will be described in detail with reference to the accompanying drawings. Furthermore, in the drawings, the same or equivalent elements are assigned with the same reference numerals, and its description is not repeated herein.

Figure 1C:
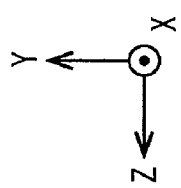
Figure 1B:
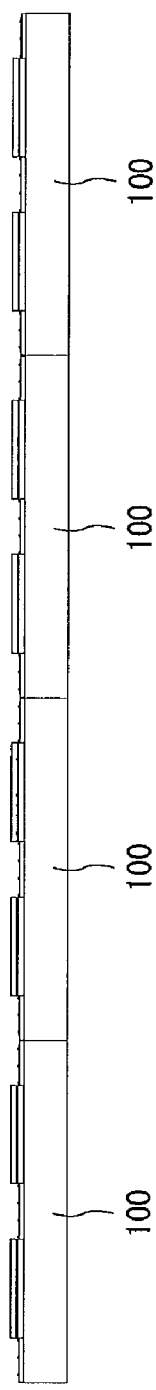

FIG. 1 is a diagram of outward appearance schematically illustrating the construction of a light illuminating apparatus 10 according to an embodiment of the present disclosure. The light illuminating apparatus 10 of this embodiment is an apparatus that is mounted in a light source apparatus for curing an ultraviolet (UV) curable ink used as an ink for sheet-fed offset printing or a UV curable resin used as an adhesive in Flat Panel Display (FPD), and is placed facing an object to be illuminated to emit UV light of a line shape to the object to be illuminated. As used herein, a lengthwise (line length) direction of UV light of a line shape emitted from the light illuminating apparatus 10 is defined as X-axis direction (first direction), a widthwise (line width) direction is defined as Y-axis direction (second direction), and a direction perpendicular (i.e., orthogonal) to X axis and Y axis is defined as Z-axis direction. Furthermore, FIG. 1A is a front view (a diagram when viewed in Z-axis direction) of the light illuminating apparatus 10 of this embodiment, FIG. 1B is a bottom view (a diagram when viewed in Y-axis direction), and FIG. 1C is a right side view (a diagram when viewed in X-axis direction).

(Construction of the Light Illuminating Apparatus 10)

Figure 2A:
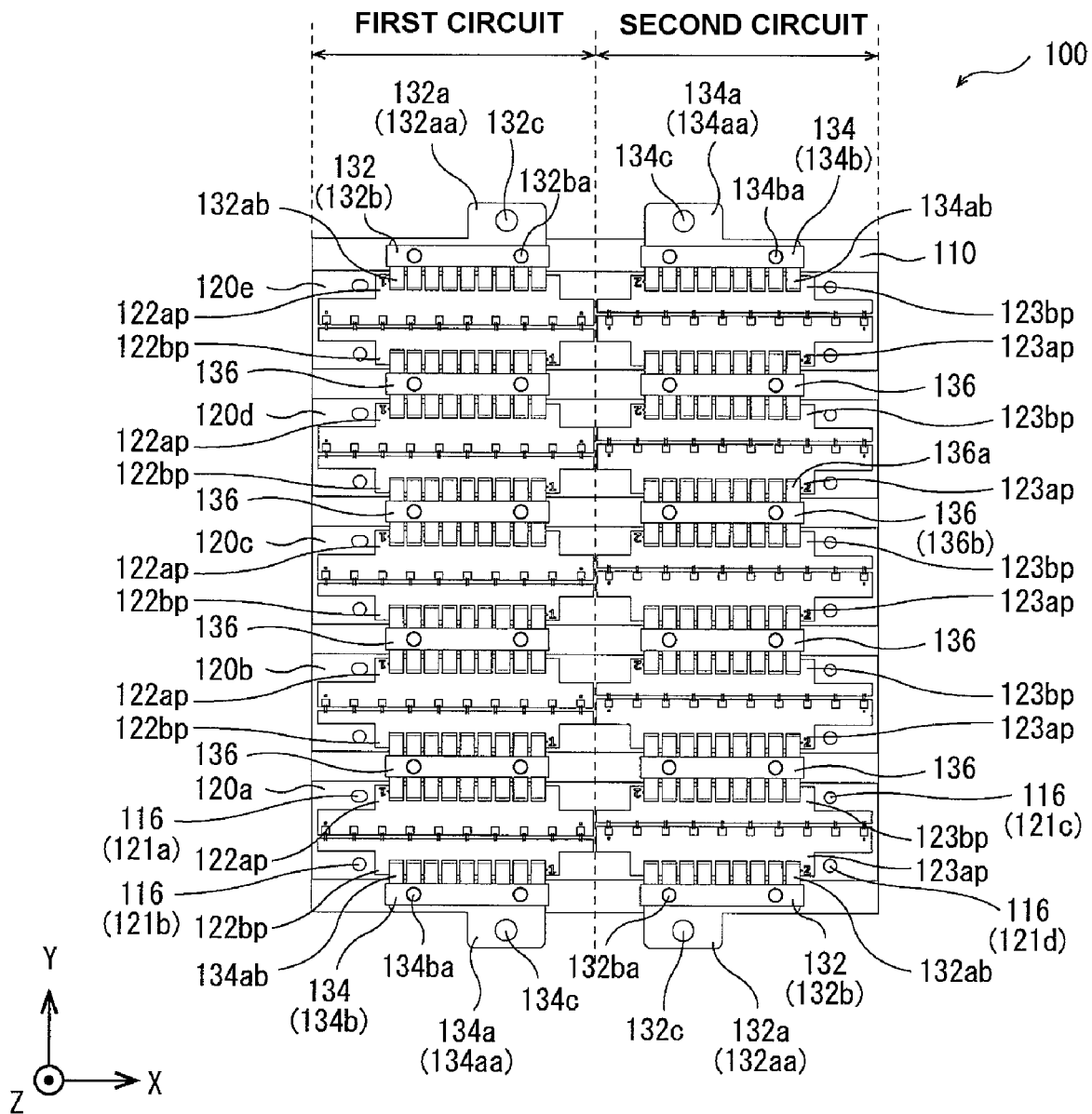
FIGS. 2A and 2B are diagrams of outward appearance schematically illustrating the construction of a light emitting diode (LED) unit provided in a light illuminating apparatus according to an embodiment of the present disclosure.
Figure 2B:
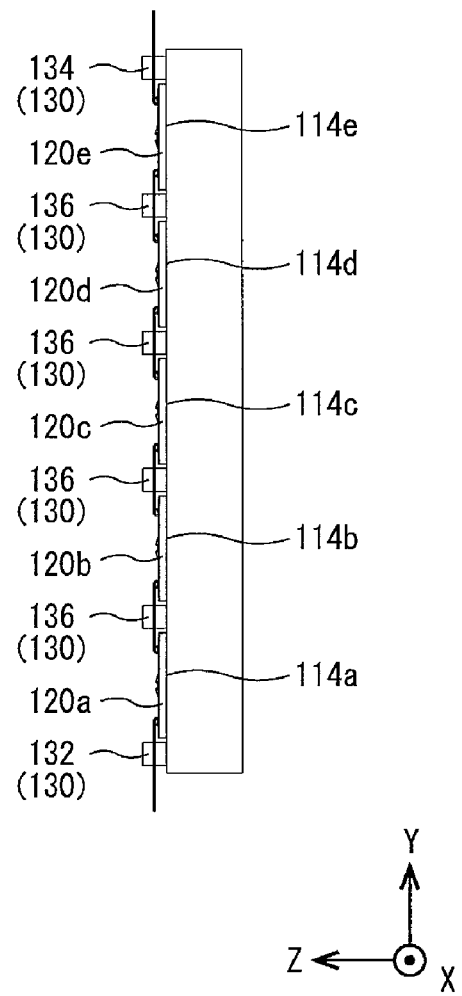

As shown in FIG. 1, the light illuminating apparatus 10 of this embodiment has a plurality of light emitting diode (LED) units 100 in a case not shown. FIG. 2 is a diagram of outward appearance schematically illustrating the construction of the LED unit 100, FIG. 2A is a front view (a diagram when viewed in Z-axis direction) of the LED unit 100, and FIG. 2B is a right side view (a diagram when viewed in X-axis direction) of the LED unit 100.

(Construction of the LED Unit 100)

As shown in FIG. 2, the LED unit 100 includes a base plate 110, LED substrate modules 120a, 120b, 120c, 120d, 120e (hereinafter, collectively referred to as a [LED substrate module 120]), end power supply terminals 132, 134, and an intermediate power supply terminal 136 (hereinafter, the end power supply terminal 132, 134 and the intermediate power supply terminal 136 are collectively referred to as a [power supply member 130]), and is an apparatus that emits UV light (as described in detail below). In this embodiment, 4 LED units 100 are arranged in a line in X-axis direction (FIG. 1).

(Construction of the Base Plate 110)

The base plate 110 is a rectangular plate-shaped member of metal (for example, aluminum or copper) to fix each component. As shown in FIG. 2, the base plate 110 of this embodiment has mounting surfaces 114a, 114b, 114c, 114d, 114e of an approximately rectangular shape on which five LED substrate modules 120a, 120b, 120c, 120d, 120e are mounted respectively. Four cylindrical bosses 116 for determining the position of each LED substrate module 120a, 120b, 120c, 120d, 120e are formed at the four corners of each mounting surface 114a, 114b, 114c, 114d, 114e. Furthermore, the base plate 110 of this embodiment has a function of a heat sink that radiates heat from each LED substrate module 120a, 120b, 120c, 120d, 120e) in air.

Furthermore, a plurality of screw holes (not shown), to which the power supply member 130 (the end power supply terminal 132, 134 and the intermediate power supply terminal 136) as described below is attached, is each formed between each LED substrate module 120a, 120b, 120c, 120d, 120e, at the outer part of the LED substrate module 120a (Y-axis direction upstream side), and at the outer part of the LED substrate module 120e (Y-axis direction downstream side).

(Construction of the LED Substrate Module 120)

As described above, the LED unit 100 of this embodiment has five LED substrate modules 120a, 120b, 120c, 120d, 120e, and the LED substrate modules 120a, 120b, 120c, 120d, 120e are respectively attached to the mounting surfaces 114a, 114b, 114c, 114d, 114e of the base plate 110, and because each LED substrate module 120a, 120b, 120c, 120d, 120e has the same construction, hereinafter, the construction of the LED substrate module 120c is representatively described.

Figure 3:
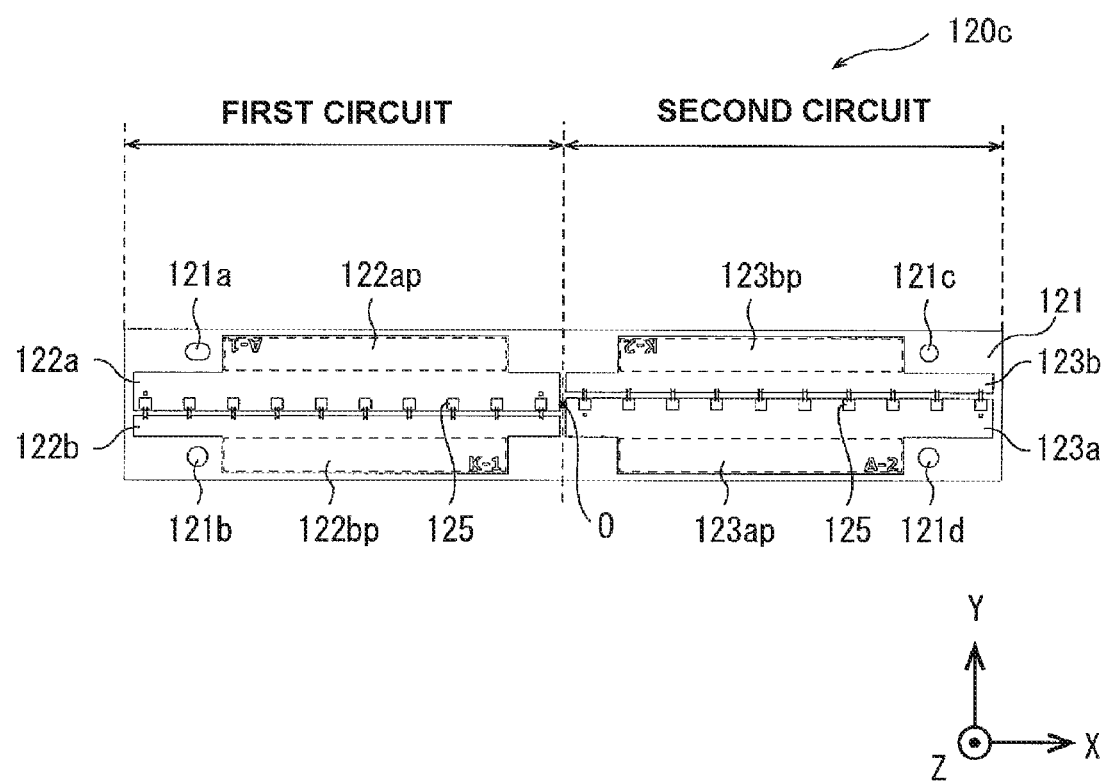
FIG. 3 is a plane view illustrating the construction of a LED substrate module provided in a light illuminating apparatus according to an embodiment of the present disclosure.

FIG. 3 is a plane view illustrating the construction of the LED substrate module 120c. As shown in FIG. 3, the LED substrate module 120c of this embodiment includes a substrate 121 of a rectangular shape parallel to X-axis direction and Y-axis direction, and a plurality of LED devices 125 placed on the substrate 121.

The substrate 121 is a rectangular shaped wiring substrate formed of a material having high thermal conductivity (for example, aluminum nitride), and as shown in FIG. 3, the substrate 121 has 20 LED devices 125 mounted at the rough center of Y-axis direction on the surface at a predetermined interval along X-axis direction by Chip On Board (COB) technology. Furthermore, two anode patterns 122a, 123a and two cathode patterns 122*b*, 123*b* are formed on the substrate 121 to supply power to each LED device 125, and the anode pattern 122*a* and the cathode pattern 122*b* and 10 LED devices 125 connected to them form a first circuit, and the anode pattern 123*a* and the cathode pattern 123*b* and 10 LED devices 125 connected to them form a second circuit. Furthermore, as shown in FIG. 3, in the first circuit, the anode pattern 122*a* is placed at an upper side (Y-axis direction upstream side) than the cathode pattern 122*b* in the drawing, and in the second circuit, the anode pattern 123*a* is placed at a lower side (Y-axis direction downstream side) than the cathode pattern 123*b* in the drawing, so that a direction in which an electric current flows in the first circuit and a direction in which an electric current flows in the second circuit are opposite to each other.

The LED device 125 of this embodiment is a so-called vertical LED chip with electrodes arranged in vertical structure, and the LED device 125 is a semiconductor device that emits UV light of 385 nm wavelength when a drive current is supplied through the anode pattern 122*a* and the cathode pattern 122*b* (or the anode pattern 123*a* and the cathode pattern 123*b*). An anode electrode is formed on the bottom surface of the LED device 125, and a cathode electrode is formed on the top surface of the LED device 125. Furthermore, the bottom surface (i.e., the anode electrode) of 10 LED devices 125 of the first circuit is directly mounted on the anode pattern 122*a*, and the cathode electrodes of 10 LED devices 125 of the first circuit are wire-bonded to the cathode pattern 122*b*. Furthermore, similarly, the bottom surface (i.e., the anode electrode) of 10 LED devices 125 of the second circuit is directly mounted on the anode pattern 123*a*, and the cathode electrodes of 10 LED devices 125 of the second circuit are wire-bonded to the cathode pattern 123*b*. As above, in this embodiment, 10 LED devices 125 of the first circuit are connected in parallel and 10 LED devices 125 of the second circuit are connected in parallel, and the first circuit and the second circuit are each independent from each other.

Furthermore, two anode patterns 122*a*, 123*a* and two cathode patterns 122*b*, 123*b* of this embodiment have, respectively, rectangular shaped terminal areas 122*ap*, 123*ap*, 122*bp*, 123*bp* (dotted line portions in FIG. 3) that come into contact with the end power supply terminal 132, 134 and the intermediate power supply terminal 136 shown in FIG. 2. The terminal area 122*ap* of the anode pattern 122*a* and the terminal area 122*bp* of the cathode pattern 122*b* are placed facing each other in Y-axis direction. Furthermore, the terminal area 123*ap* of the anode pattern 123*a* and the terminal area 123*bp* of the cathode pattern 123*b* are placed facing each other in Y-axis direction. Furthermore, the terminal area 122*ap* of the anode pattern 122*a* and the terminal area 123*bp* of the cathode pattern 123*b* are arranged in a row in X-axis direction, the terminal area 122*bp* of the cathode pattern 122*b* and the terminal area 123*ap* of the anode pattern 123*a* are arranged in a row in X-axis direction, and the terminal areas 122*ap*, 123*ap* of the two anode patterns 122*a*, 123*a* and the terminal areas 122*bp*, 123*bp* of the two cathode patterns 122*b*, 123*b* are respectively point-symmetrical with respect to the center O of the substrate 121 as a symmetry point. That is, each electrode (i.e., the terminal areas 122*ap*, 123*ap*, 122*bp*, 123*bp*) of the substrate 121 of this embodiment has no directionality with respect to the power supply member 130. Accordingly, there is no need to pay attention to directionality of the LED substrate module 120*c* at all when attaching the LED substrate module 120*c* to the base plate 110 as well as replacing the LED substrate module 120*c*. Furthermore, the same is the case when attaching the LED substrate modules 120*a*, 120*b*, 120*d*, 120*e* to the base plate 110 or replacing the LED substrate modules 120*a*, 120*b*, 120*d*, 120*e*. Accordingly, by this construction, maintenance of the light illuminating apparatus 10 (FIG. 1) is remarkably improved.

Furthermore, as shown in FIG. 3, through-holes 121*a*, 121*b*, 121*c*, 121*d* are formed at the four corners of the substrate 121, and when each LED substrate module 120 is attached to the base plate 110, the cylindrical bosses 116 of the base plate 110 are inserted into and pass through the through-holes 121*a*, 121*b*, 121*c*, 121*d* to determine the position (FIG. 2). Furthermore, to increase thermal conductivity between the LED substrate modules 120*a*, 120*b*, 120*c*, 120*d*, 120*e* and the base plate 110 shown in FIG. 2, for example, heat-radiating grease or an adhesive having high thermal conductivity may be applied between the back surface of the LED substrate module 120 and each mounting surface 114*a*, 114*b*, 114*c*, 114*d*, 114*e*.

(Construction of the Power Supply Member 130)

As shown in FIG. 2, the power supply member 130 is attached to the base plate 110 on the LED substrate modules 120*a*, 120*b*, 120*c*, 120*d*, 120*e*) (Z-axis direction downstream side), and elastic compression is applied to each substrate 121 of the LED substrate modules 120*a*, 120*b*, 120*c*, 120*d*, 120*e* against the base plate 110, and along with this, power is supplied to each electrode (i.e., the terminal areas 122*ap*, 123*ap*, 122*bp*, 123*bp*) of each substrate 121. The power supply member 130 of this embodiment includes a pair of end power supply terminals 132, 134 disposed at the two end parts of Y-axis direction (i.e., connected to the LED substrate modules 120*a* and 120*e*), and eight intermediate power supply terminals 136 placed between each LED substrate module 120*a*, 120*b*, 120*c*, 120*d*, 120*e*.

Figure 4A:
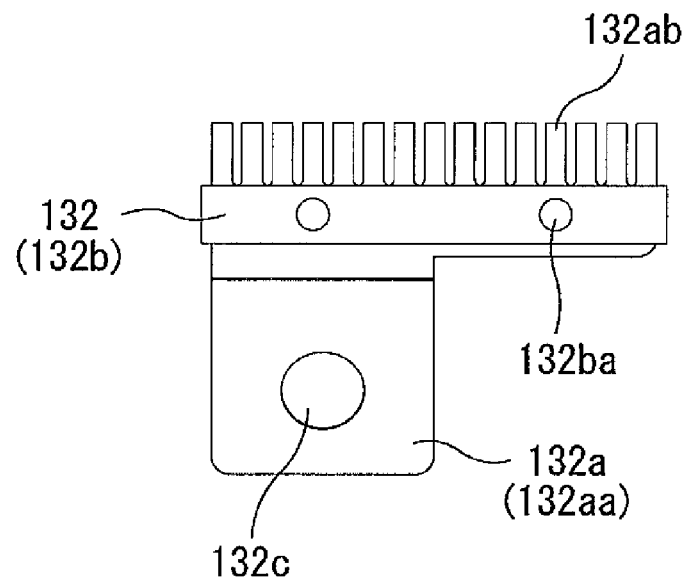
FIGS. 4A and 4B are diagrams illustrating the construction of an end power supply terminal provided in a light illuminating apparatus according to an embodiment of the present disclosure.
Figure 4B:
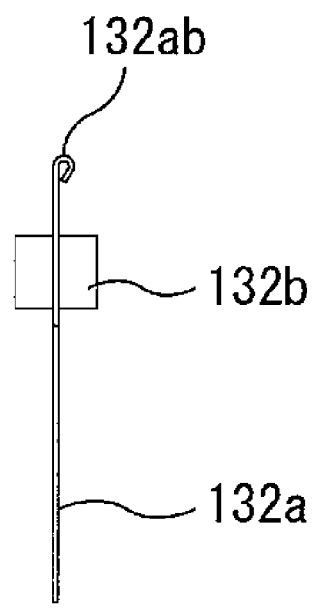
Figure 5A:
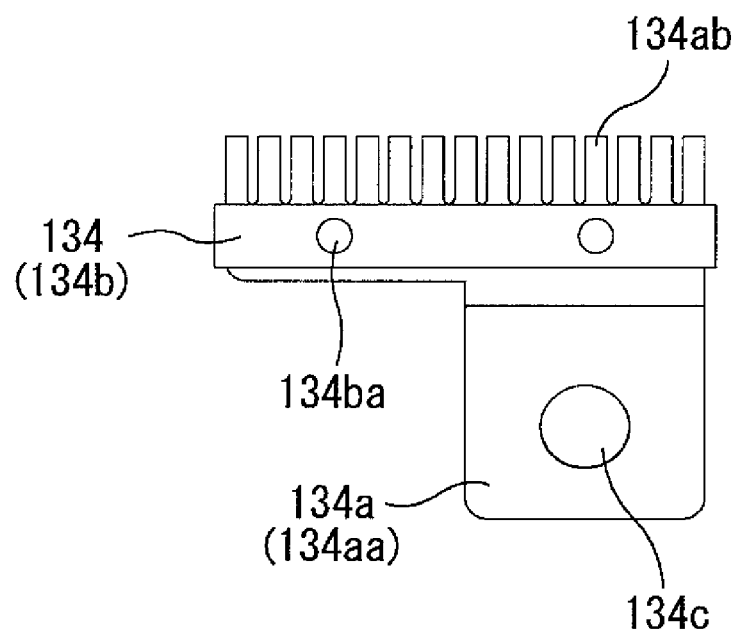
FIGS. 5A and 5B are diagrams illustrating the construction of an end power supply terminal provided in a light illuminating apparatus according to an embodiment of the present disclosure.
Figure 5B:
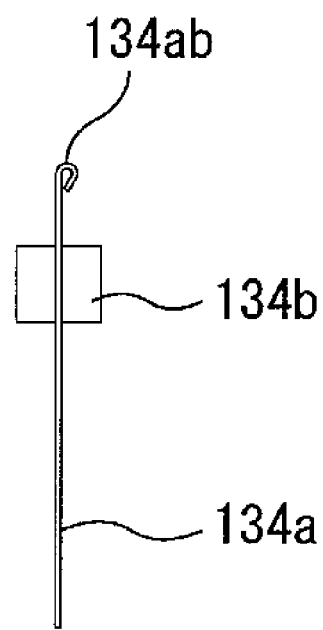
Figure 6A:
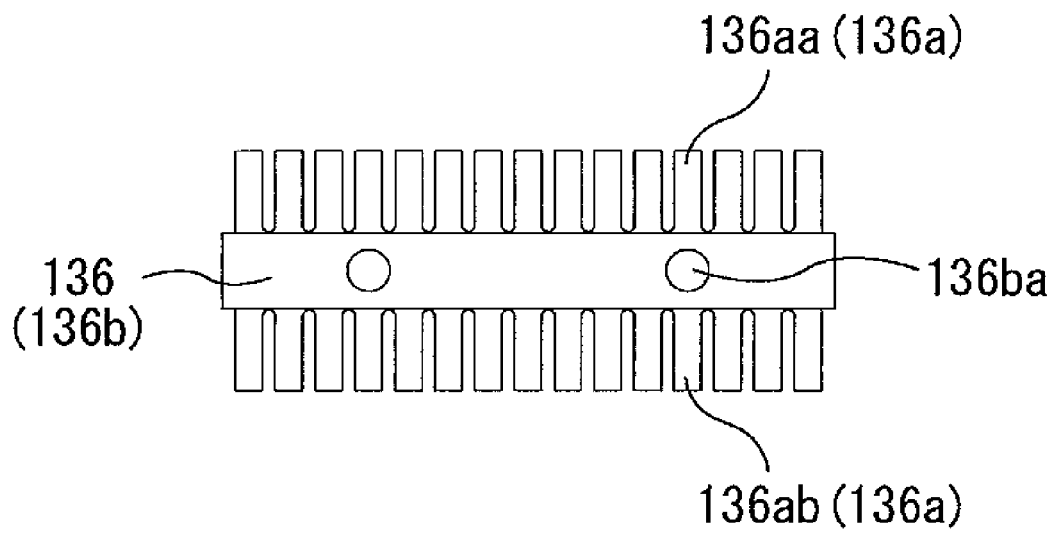
FIGS. 6A and 6B are diagrams illustrating the construction of an intermediate power supply terminal provided in a light illuminating apparatus according to an embodiment of the present disclosure.
Figure 6B:
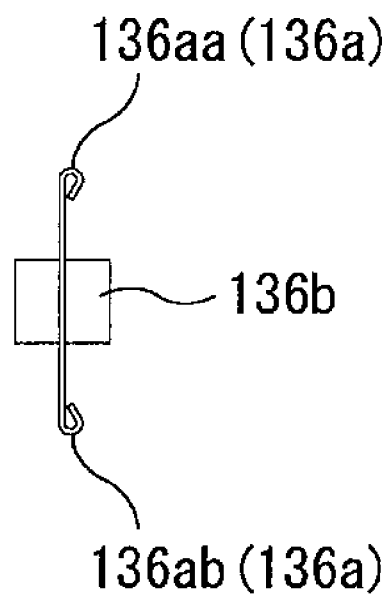

FIG. 4 is a diagram illustrating the construction of the end power supply terminal 132, FIG. 4A is a plane view, and FIG. 4B is a right side view. Furthermore, FIG. 5 is a diagram illustrating the construction of the end power supply terminal 134, FIG. 5A is a plane view, and FIG. 5B is a right side view. Furthermore, FIG. 6 is a diagram illustrating the construction of the intermediate power supply terminal 136, FIG. 6A is a plane view, and FIG. 6B is a right side view.

As shown in FIG. 4, the end power supply terminal 132 includes a conducting part 132*a* formed by punching a thin plate of metal (for example, copper), and a fixing part 132*b* of an insulating property (for example, made of resin), each fixing part being fixed to the base plate 110 (FIG. 2) with the conducting part 132*a* interposed between in plate thickness direction. The end power supply terminal 132 has a plurality of through-holes 132*ba* passing through the fixing part 132*b* and the conducting part 132*a*, and screws not shown are rotatably put into the screw holes (not shown) of the base plate 110 (FIG. 2) through the through-holes 132*ba*, to fix the end power supply terminal 132 to the base plate 110 (FIG. 2).

The conducting part 132*a* includes an anode plate 132*aa* of an approximately rectangular shape protruding from the fixing part 132*b* in Y-axis direction when viewed from the top (when viewed in Z-axis direction), and a contact point part 132*ab* protruding in a comb-teeth shape in the direction opposite to the anode plate 132*aa* and having a spring property at the front end part. Furthermore, the anode plate 132*aa* has a through-hole 132*c*.

As shown in FIG. 5, similar to the end power supply terminal 132, the end power supply terminal 134 includes a conducting part 134*a* formed by punching a thin plate of metal (for example, copper) and a fixing part 134*b* of an insulating property (for example, made of resin), each fixing part being fixed to the base plate 110 with the conducting part 134a interposed between in plate thickness direction. The end power supply terminal 134 has a plurality of through-holes 134ba passing through the fixing part 134b and the conducting part 134a, and screws not shown are rotatably put into the screw holes (not shown) of the base plate 110 (FIG. 2) through the through-holes 134ba, to fix the end power supply terminal 134 to the base plate 110 (FIG. 2).

The conducting part 134a includes a cathode plate 134aa of an approximately rectangular shape protruding from the fixing part 134b in Y-axis direction when viewed from the top (when viewed in Z-axis direction), and a contact point part 134ab protruding in a comb-teeth shape in the direction opposite to the cathode plate 134aa and having a spring property at the front end part. Furthermore, the cathode plate 134aa has a through-hole 134c.

As shown in FIG. 2, the anode plate 132aa and the cathode plate 134aa of the end power supply terminals 132, 134 respectively connected to the LED substrate modules 120a and 120e are disposed on an anode terminal and a cathode terminal not shown when the end power supply terminals 132, 134 are attached to the base plate 110, and when screws not shown are each attached to the anode terminal and the cathode terminal not shown through the through-holes 132c, 134c, the anode plate 132aa and the anode terminal are electrically connected and the cathode plate 134aa and the cathode terminal are electrically connected. The anode terminal and the cathode terminal are connected to a power source apparatus not shown, and when power is supplied from the power source apparatus, power is supplied to the anode plate 132aa and the cathode plate 134aa of the LED substrate modules 120a and 120e. Furthermore, when the end power supply terminal 132 connected to the LED substrate modules 120a and 120e is attached to the base plate 110, the contact point part 132ab presses the terminal areas 122ap and 123ap of the LED substrate modules 120a and 120e to electrically and thermally connect the substrate 121 (FIG. 3) of the LED substrate modules 120a and 120e to the base plate 110. Furthermore, when the end power supply terminal 134 connected to the LED substrate modules 120a and 120e is attached to the base plate 110, the contact point part 134ab presses the terminal areas 123bp and 122bp of the LED substrate modules 120a and 120e to electrically and thermally connect the substrate 121 (FIG. 3) of the LED substrate modules 120a and 120e to the base plate 110.

As shown in FIG. 2, the intermediate power supply terminal 136 is a member which is each placed between each LED substrate module 120a, 120b, 120c, 120d, 120e to respectively connect in series the first circuit and the second circuit of each LED substrate module 120a, 120b, 120c, 120d, 120e (FIG. 3).

As shown in FIG. 6, the intermediate power supply terminal 136 includes a conducting part 136a formed by punching a thin plate of metal (for example, copper) and a fixing part 136b of an insulating property (for example, made of resin), each fixing part being fixed to the base plate 110 (FIG. 2) with the conducting part 136a interposed between in plate thickness direction. The intermediate power supply terminal 136 has a plurality of through-holes 136ba passing through the fixing part 136b and the conducting part 136a, and screws not shown are rotatably put into the screw holes (not shown) of the base plate 110 (FIG. 2) through the through-holes 136ba, to fix the intermediate power supply terminal 136 to the base plate 110 (FIG. 2).

As shown in FIG. 6, the conducting part 136a has contact point parts 136aa, 136ab that protrude from the fixing part 136b in a comb-teeth shape in Y-axis direction and in the direction opposite to Y-axis direction, and have a spring property at the front end part. Furthermore, as shown in FIG. 2, when four intermediate power supply terminals 136 are attached to the first circuit side (i.e., X-axis direction downstream side) between each LED substrate module 120a, 120b, 120c, 120d, 120e, the terminal area 122bp of the LED substrate module 120e and the terminal area 122ap of the LED substrate module 120d, the terminal area 122bp of the LED substrate module 120d and the terminal area 122ap of the LED substrate module 120c, the terminal area 122bp of the LED substrate module 120c and the terminal area 122ap of the LED substrate module 120b, and the terminal area 122bp of the LED substrate module 120b and the terminal area 122ap of the LED substrate module 120a are respectively pressed and electrically connected. Furthermore, when four intermediate power supply terminals 136 are attached to the second circuit side (i.e., X-axis direction upstream side) between each LED substrate module 120a, 120b, 120c, 120d, 120e, the terminal area 123bp of the LED substrate module 120a and the terminal area 123ap of the LED substrate module 120b, the terminal area 123bp of the LED substrate module 120b and the terminal area 123ap of the LED substrate module 120c, the terminal area 123bp of the LED substrate module 120c and the terminal area 123ap of the LED substrate module 120d, and the terminal area 123bp of the LED substrate module 120d and the terminal area 123ap of the LED substrate module 120e are respectively pressed and electrically connected.

Figure 7:
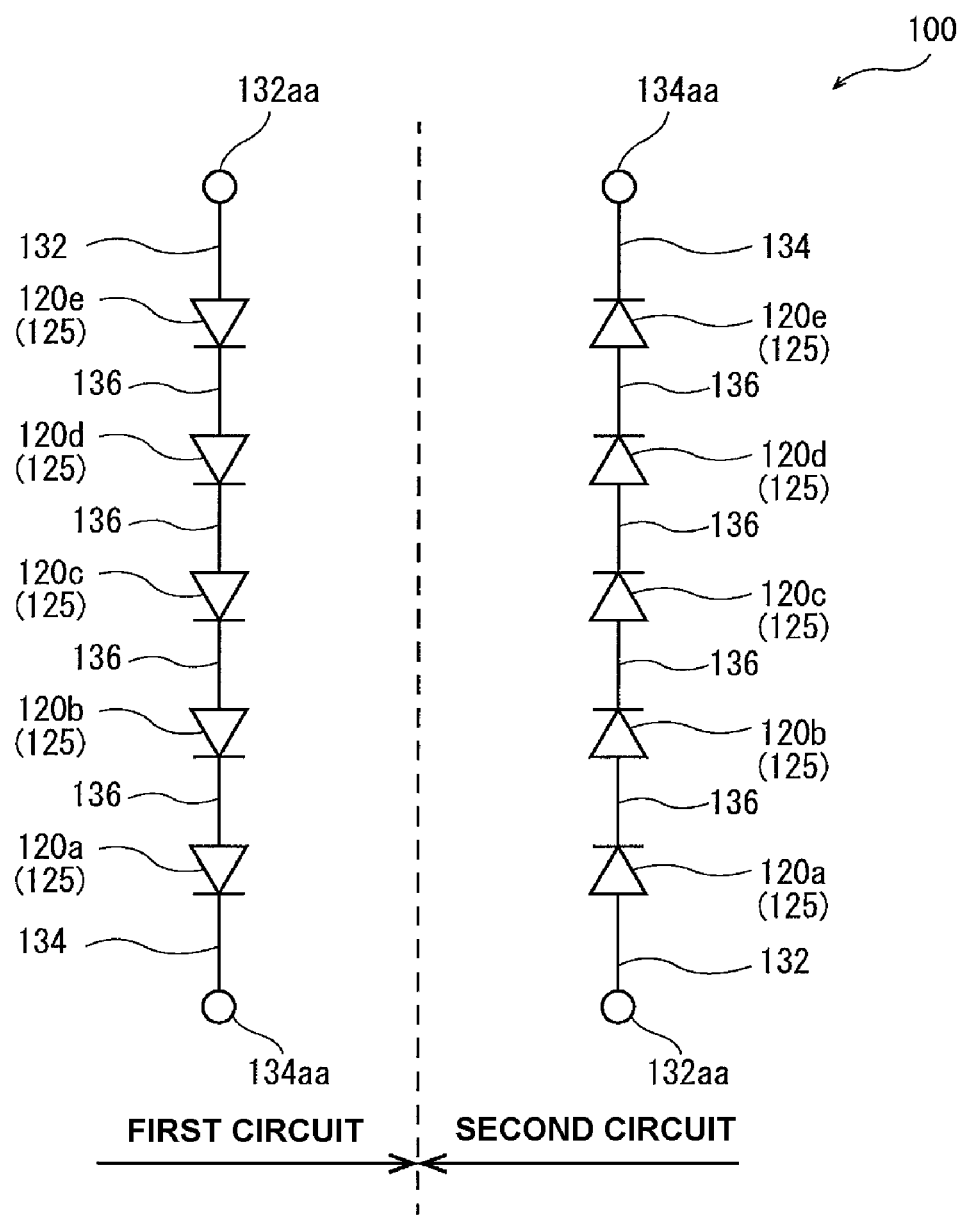
FIG. 7 is an equivalent circuit diagram of a LED substrate module provided in a light illuminating apparatus according to an embodiment of the present disclosure.

As hereinabove described, when the power supply member 130 (i.e., the end power supply terminal 132, 134 and the intermediate power supply terminal 136) is attached to all the LED substrate modules 120a, 120b, 120c, 120d, 120e, each first circuit of each LED substrate module 120a, 120b, 120c, 120d, 120e is connected in series and each second circuit is connected in series, and an equivalent circuit diagram is as shown in FIG. 7. Furthermore, when power is supplied from the power source apparatus not shown to the anode plate 132aa and the cathode plate 134aa of the LED unit 100, power is supplied to the LED devices 125 of the first circuit and the second circuit of each LED substrate module 120a, 120b, 120c, 120d, 120e through the end power supply terminal 132, 134 and the intermediate power supply terminal 136, and UV light of a predetermined intensity is emitted from each LED device 125. Furthermore, in FIG. 7, for the sake of clarity of the drawing, each first circuit (i.e., 10 LED devices 125 connected in parallel) and each second circuit (i.e., 10 LED devices 125 connected in parallel) of the LED substrate modules 120a, 120b, 120c, 120d, 120e is each expressed as one LED symbol.

As above, in this embodiment, the power supply member 130 connecting five LED substrate modules 120a, 120b, 120c, 120d, 120e in series has a function to electrically connect each substrate 121 and a function to fix to the base plate 110 (FIG. 2). Accordingly, attachment and replacement of the LED substrate modules 120a, 120b, 120c, 120d, 120e can be easily accomplished by attachment and removal of the power supply member 130. Furthermore, because each LED substrate module 120a, 120b, 120c, 120d, 120e has no directionality with respect to the power supply member 130, there is no need to pay attention to the directionality at all when attaching each LED substrate module 120a, 120b, 120c, 120d, 120e to the base plate 110 and even when replacing each LED substrate module 120a, 120b, 120c, 120d, 120e. Accordingly, by this construction, maintenance of the light illuminating apparatus 10 is remarkably improved.

While this embodiment has been hereinabove described, the present disclosure is not limited thereto, and many modifications may be made in the scope of the technical spirit of the present disclosure.

For example, although it is described that the light illuminating apparatus 10 of this embodiment has a plurality of LED units 100, the present disclosure is not necessarily limited thereto, and the light illuminating apparatus 10 may have one LED unit 100 according to use.

Furthermore, although this embodiment is configured to emit UV light of 385 nm wavelength, the present disclosure is not limited thereto, and may be configured to emit UV light of other wavelength (for example, 365 nm wavelength, 385 nm wavelength, 395 nm wavelength, 405 nm wavelength) or to emit visible light or infrared light. Furthermore, although it is described that five LED substrate modules 120a, 120b, 120c, 120d, 120e have the same LED device 125 mounted thereon, for example, each LED substrate module 120a, 120b, 120c, 120d, 120e may have LED devices of different wavelengths mounted thereon to irradiate light of mixed wavelengths.

Furthermore, although it is described that the LED substrate module 120 of this embodiment has a first circuit and a second circuit independent from each other in Y-axis direction (FIG. 3), the present disclosure is not necessarily limited thereto. For the substrate 121 of each LED substrate module 120 to have no directionality with respect to the power supply member 130, the terminal area 122ap, 123ap of the anode pattern 122a, 123a and the terminal area 122bp, 123bp of the cathode pattern 122b, 123b on the substrate 121 may be point-symmetrical with the respect of the center O of the substrate 121 as a symmetry point, and 2n circuits (n is an integer greater than or equal to 1) independent from each other in the first direction may be formed on the substrate 121.

Furthermore, although this embodiment is described that five LED substrate modules 120a, 120b, 120c, 120d, 120e placed along Y-axis direction are electrically connected by the power supply member 130 (FIG. 2), the present disclosure is not limited thereto, and M LED substrate modules 120 (M is an integer greater than or equal to 2) may be placed in Y-axis direction. Accordingly, provided that the number of circuits of each LED substrate module 120 and the number of LED substrate modules 120 is generalized and a relationship between the LED substrate module 120 and the power supply member 130 is considered, the light illuminating apparatus of the present disclosure is as below. That is, in the light illuminating apparatus of the present disclosure, when $1^{st}$ to $M^{th}$ LED substrate modules 120 are set in a sequential order along Y-axis direction and $1^{st}$ to $2n^{th}$ circuits are set in a sequential order along X-axis direction in each LED substrate module 120, the intermediate power supply terminal 136 (connecting member) is placed between the terminal area 122bp or 123bp (second electrode) and the terminal area 122ap or 123ap (first electrode) facing each other between the $i^{th}$ LED substrate module 120 (i is an integer greater than or equal to 1 and less than or equal to M−1) and the i+$1^{th}$ LED substrate module 120. Furthermore, the end power supply terminal 132 (first power supply member) is connected to the terminal area 122ap or 123ap (first electrode) of the 2j−$1^{th}$ circuit (j is an integer greater than or equal to 1 and less than or equal to n) formed in the $1^{st}$ LED substrate module 120 and the $2j^{th}$ circuit formed in the $M^{th}$ LED substrate module 120. Furthermore, the end power supply terminal 134 (second power supply member) is connected to the terminal area 122bp or 123bp (second electrode) of the 2j−$1^{th}$ circuit formed in the $M^{th}$ LED substrate module 120 and the $2j^{th}$ circuit formed in the $1^{st}$ LED substrate module 120.

(First Variation)

Figure 8:
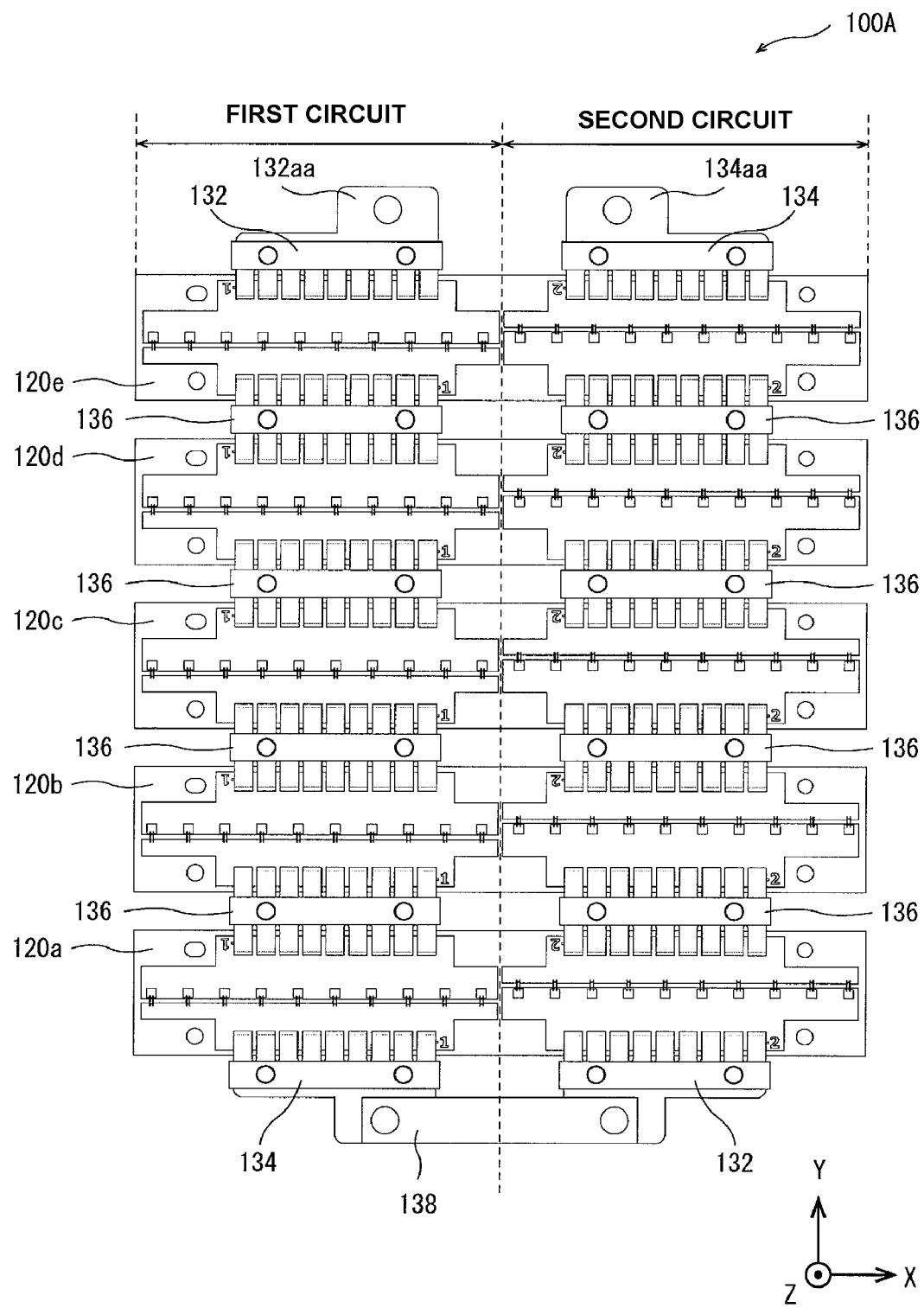
FIG. 8 is a diagram showing a first variation of a LED unit provided in a light illuminating apparatus according to an embodiment of the present disclosure.
Figure 9:
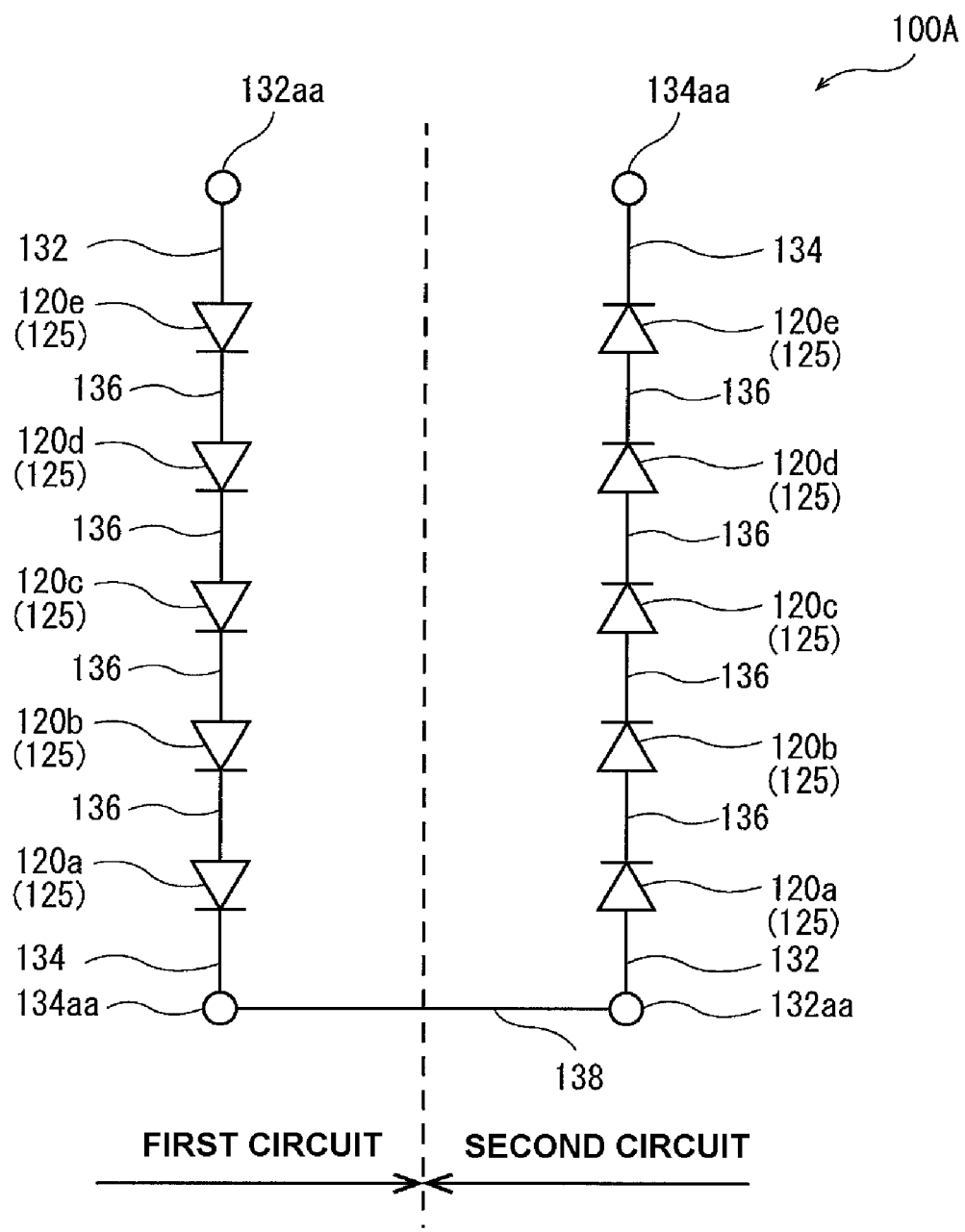
FIG. 9 is an equivalent circuit diagram of a LED substrate module shown in FIG. 8.

FIG. 8 is a diagram showing a first variation of the LED unit 100 of this embodiment. A LED unit 100A of this variation is different from the LED unit 100 of this embodiment in the respect that the LED unit 100A has a short bar 138 between the end power supply terminals 132, 134 connected to the LED substrate module 120a. FIG. 9 is an equivalent circuit diagram of the LED unit 100A of this variation. As shown in FIG. 9, in this variation, because the end power supply terminals 132, 134 are connected by the short bar 138, the first circuit and the second circuit are successive, forming a series circuit. Accordingly, the number of circuits on the LED unit 100A reduces, the LED substrate module 120a does not need to have an anode terminal for connecting to the anode plate 132aa, and a cathode terminal for connecting to the cathode plate 134aa.

(Second Variation)

Figure 10:
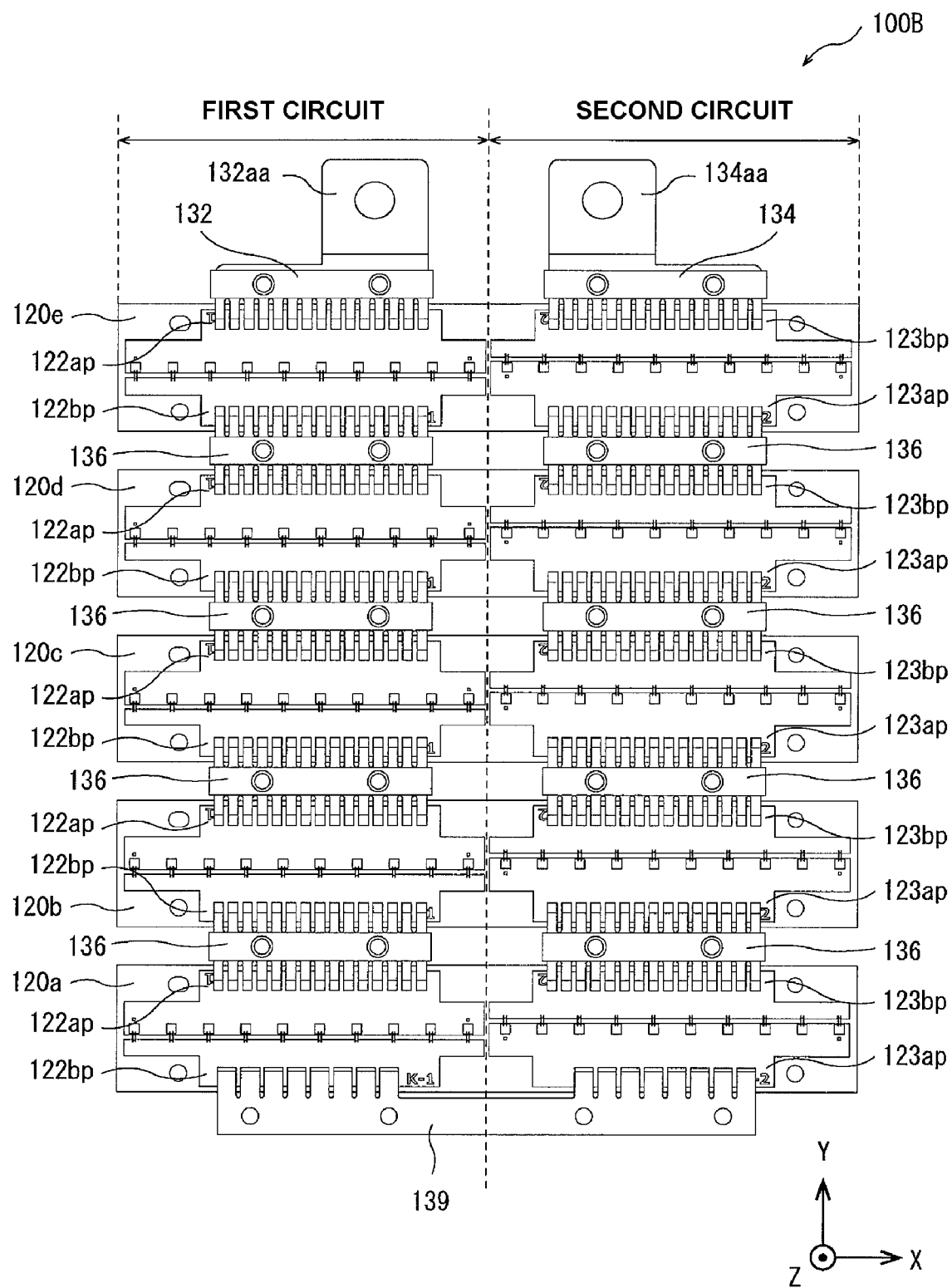
FIG. 10 is a diagram showing a second variation of a LED unit provided in a light illuminating apparatus according to an embodiment of the present disclosure.

FIG. 10 is a diagram showing a second variation of the LED unit 100 of this embodiment. A LED unit 100B of this variation is different from the LED unit 100A of the first variation in the respect that the LED unit 100B has an integrated end power supply terminal 139 instead of the end power supply terminal 132, 134 connected to the LED substrate module 120a and the short bar 138.

Provided that in this variation, the number of circuits of each LED substrate module 120 and the number of LED substrate modules 120 is generalized and a relationship between the LED substrate module 120 and the power supply member 130 is considered, the light illuminating apparatus of the present disclosure is as below. That is, in the light illuminating apparatus, when $1^{st}$ to $M^{th}$ LED substrate modules 120 are set in a sequential order along Y-axis direction and $1^{st}$ to $2n^{th}$ circuits are set in a sequential order along X-axis direction in each LED substrate module 120, the intermediate power supply terminal 136 (first connecting member) is placed between the terminal area 122bp or 123bp (second electrode) and the terminal area 122ap or 123ap (first electrode) facing each other between the $i^{th}$ LED substrate module 120 (i is an integer greater than or equal to 1 and less than or equal to M−1) and the i+$1^{th}$ LED substrate module 120. Furthermore, the end power supply terminal 139 (second connecting member) is placed between the terminal area 122bp or 123bp (second electrode) of the 2j−$1^{th}$ circuit (j is an integer greater than or equal to 1 and less than or equal to n) and the terminal area 122ap or 123ap (first electrode) of the $2j^{th}$ circuit formed in the $M^{th}$ LED substrate module 120. Furthermore, the end power supply terminal 132 (first power supply member) is connected to the terminal area 122ap or 123ap (first electrode) of the 2j−$1^{th}$ circuit formed in the $1^{st}$ LED substrate module 120. Furthermore, the end power supply terminal 134 (second power supply member) is connected to the terminal area 122bp or 123bp (second electrode) of the $2j^{th}$ circuit formed in the $1^{st}$ LED substrate module 120.

(Third Variation)

Figure 11:
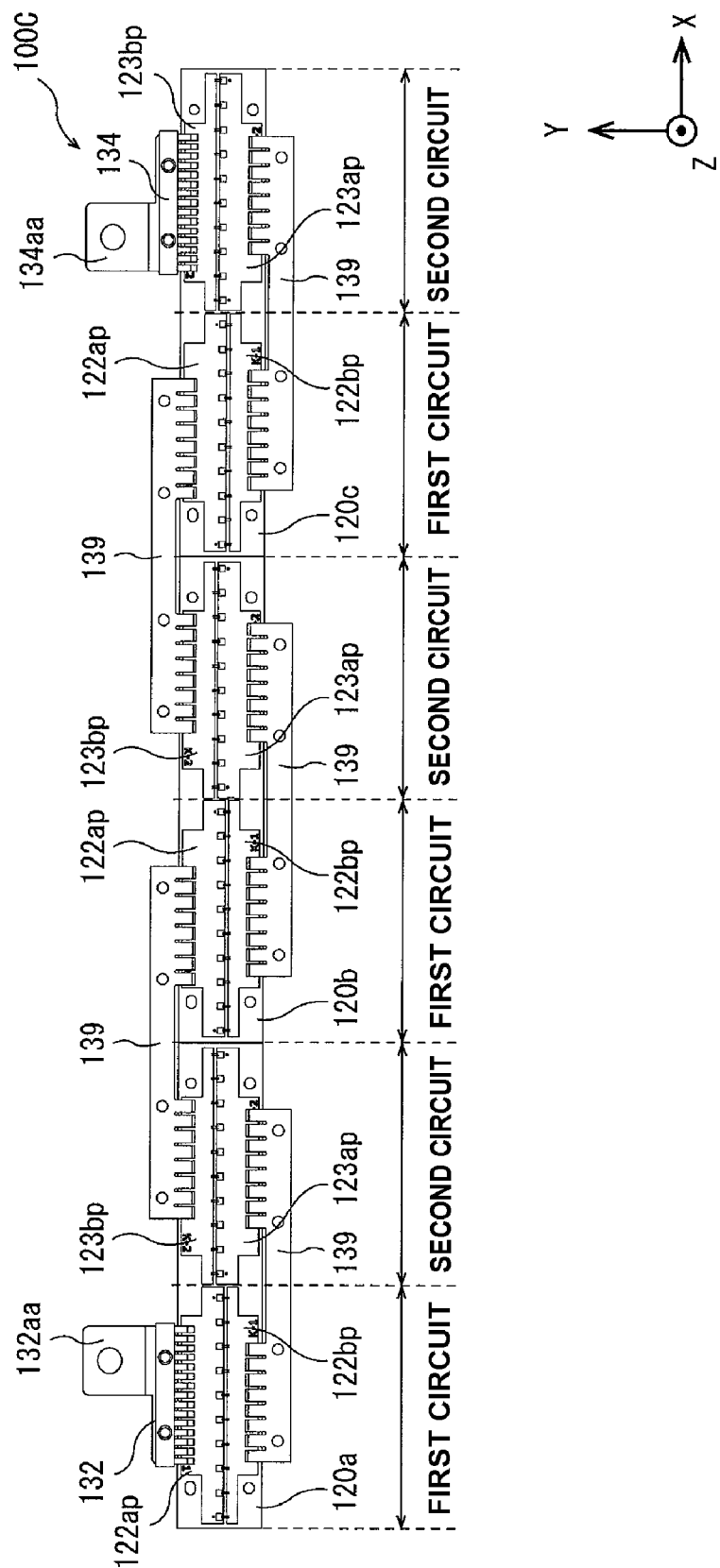
FIG. 11 is a diagram showing a third variation of a LED unit provided in a light illuminating apparatus according to an embodiment of the present disclosure.

FIG. 11 is a diagram showing a third variation of the LED unit 100 of this embodiment. A LED unit 100C this variation is different from the LED unit 100 of this embodiment in the respect that the LED unit 100C is configured such that the LED substrate modules 120a, 120b, 120c are arranged in X-axis direction, the first circuit and the second circuit of each LED substrate module 120a, 120b, 120c are connected by the end power supply terminal 139, and the second circuit of each LED substrate module 120a, 120b, 120c and the first circuit of an adjacent LED substrate module are also connected by the end power supply terminal 139. That is, in this variation, the end power supply terminal 139 is installed between the terminal area 122bp and the terminal area 123ap of each LED substrate module 120a, 120b, 120c, between the terminal area 123bp of the LED substrate module 120a and the terminal area 122ap of the LED substrate module 120b, and between the terminal area 123bp of the LED substrate module 120b and the terminal area 122ap of the LED substrate module 120c. By this construction, the dimension in Y-axis direction can be restrained.

Provided that in this variation, the number of circuits of each LED substrate module 120 and the number of LED substrate modules 120 is generalized and a relationship between the LED substrate module 120 and the power supply member 130 is considered, the light illuminating apparatus of the present disclosure is as below. That is, in the light illuminating apparatus, when $1^{st}$ to $N^{th}$ LED substrate modules 120 are set in a sequential order along X-axis direction and $1^{st}$ to $2n^{th}$ circuits are set in a sequential order along X-axis direction in each LED substrate module 120, the end power supply terminal 139 (connecting member) is placed between the terminal area 122bp or 123bp (second electrode) of the $j^{th}$ circuit (j is an integer greater than or equal to 1 and less than or equal to 2n−1) and the terminal area 122ap or 123ap (first electrode) of the $j+1^{th}$ circuit formed in the $i^{th}$ LED substrate module 120 (i is an integer greater than or equal to 1 and less than or equal to N−1), and between the terminal area 122bp or 123bp (second electrode) of the $2n^{th}$ circuit formed in the $i^{th}$ LED substrate module 120 and the terminal area 122ap or 123ap (first electrode) of the $1^{st}$ circuit formed in the $i+1^{th}$ LED substrate module 120. Furthermore, the end power supply terminal 132 (first power supply member) is connected to the terminal area 122ap or 123ap (first electrode) of the $1^{st}$ circuit formed in the $1^{st}$ LED substrate module 120. Furthermore, the end power supply terminal 134 (second power supply member) is connected to the terminal area 122bp or 123bp (second electrode) of the $2n^{th}$ circuit formed in the $N^{th}$ LED substrate module 120.

(Fourth Variation)

Figure 12:
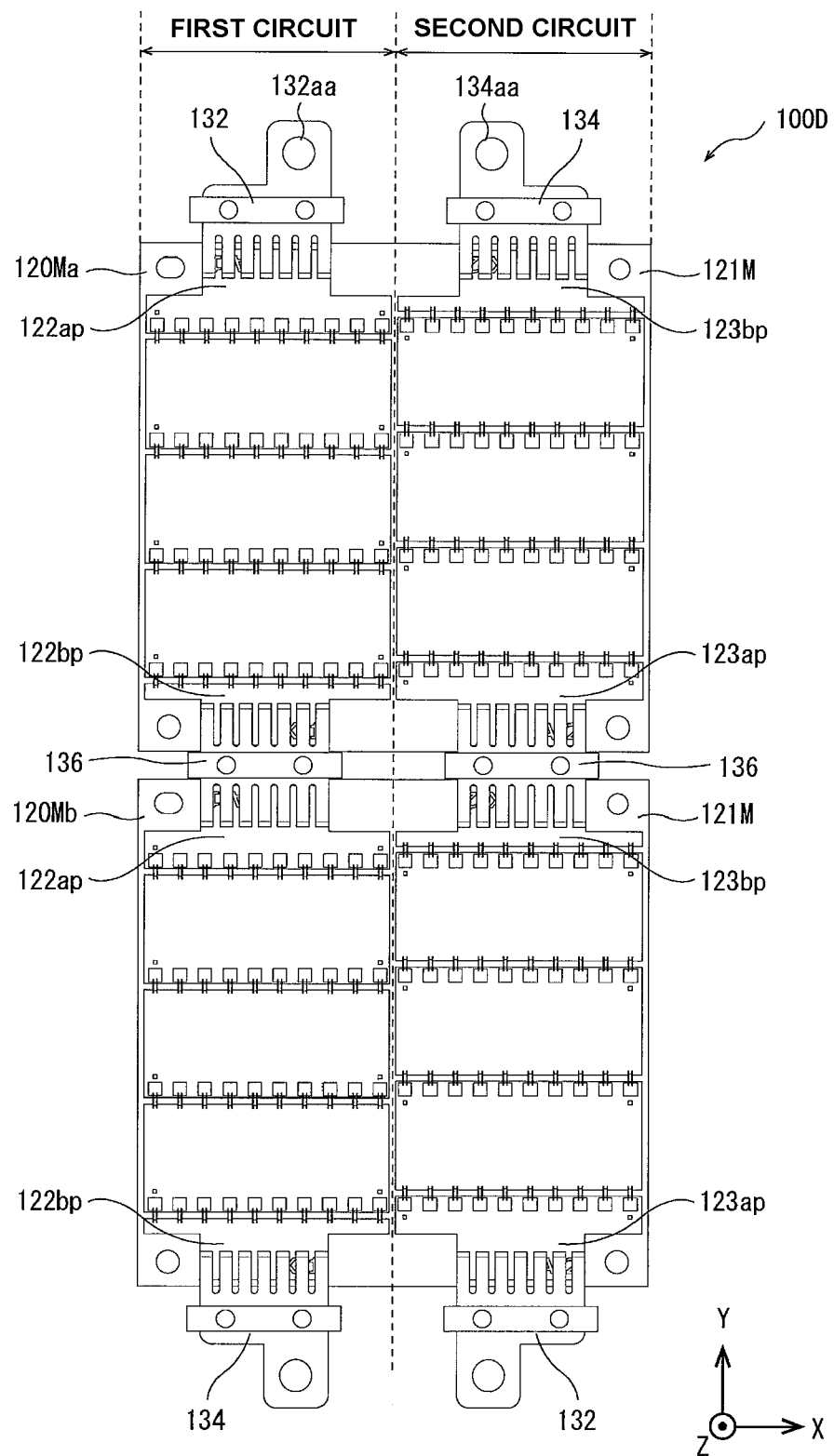
FIG. 12 is a diagram showing a fourth variation of a LED unit provided in a light illuminating apparatus according to an embodiment of the present disclosure.
Figure 13:
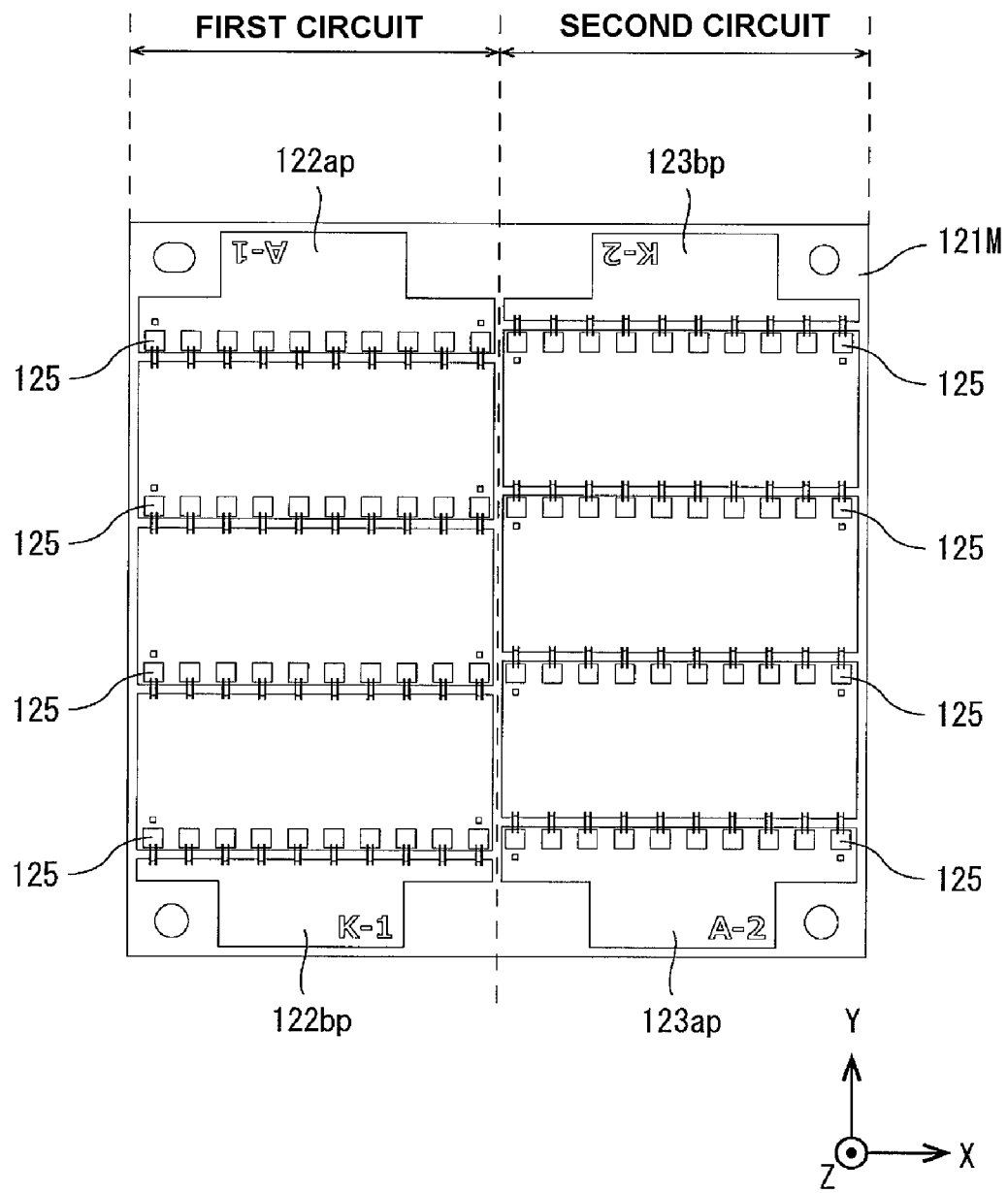
FIG. 13 is a diagram showing a fourth variation of a LED unit provided in a light illuminating apparatus according to an embodiment of the present disclosure.

FIGS. 12 and 13 are diagrams showing a fourth variation of the LED unit 100 of this embodiment. A LED unit 100D of this variation is different from the LED unit 100 of this embodiment, as shown in FIG. 13, in the respect of the LED unit 100D on which a substrate 121M having a first circuit and a second circuit is mounted, in which four circuits each consisting of ten LED devices 125 connected in parallel are connected in series, forming each of the first circuit and the second circuit. Furthermore, as shown in FIG. 12, the LED unit 100D of this variation is different from the LED unit 100A of the first variation in the respect that LED substrate modules 120Ma and 120Mb having the substrate 121M mounted thereon are provided in Y-axis direction. According to the construction of this variation, the number of intermediate power supply terminals 136 connecting the substrates 121M can be reduced as compared to the first variation, making it possible to easily realize the LED unit 100D with large area and high output. Furthermore, it is possible to reduce manufacturing costs as compared to the construction using one large-area substrate.

(Fifth Variation)

Figure 14:
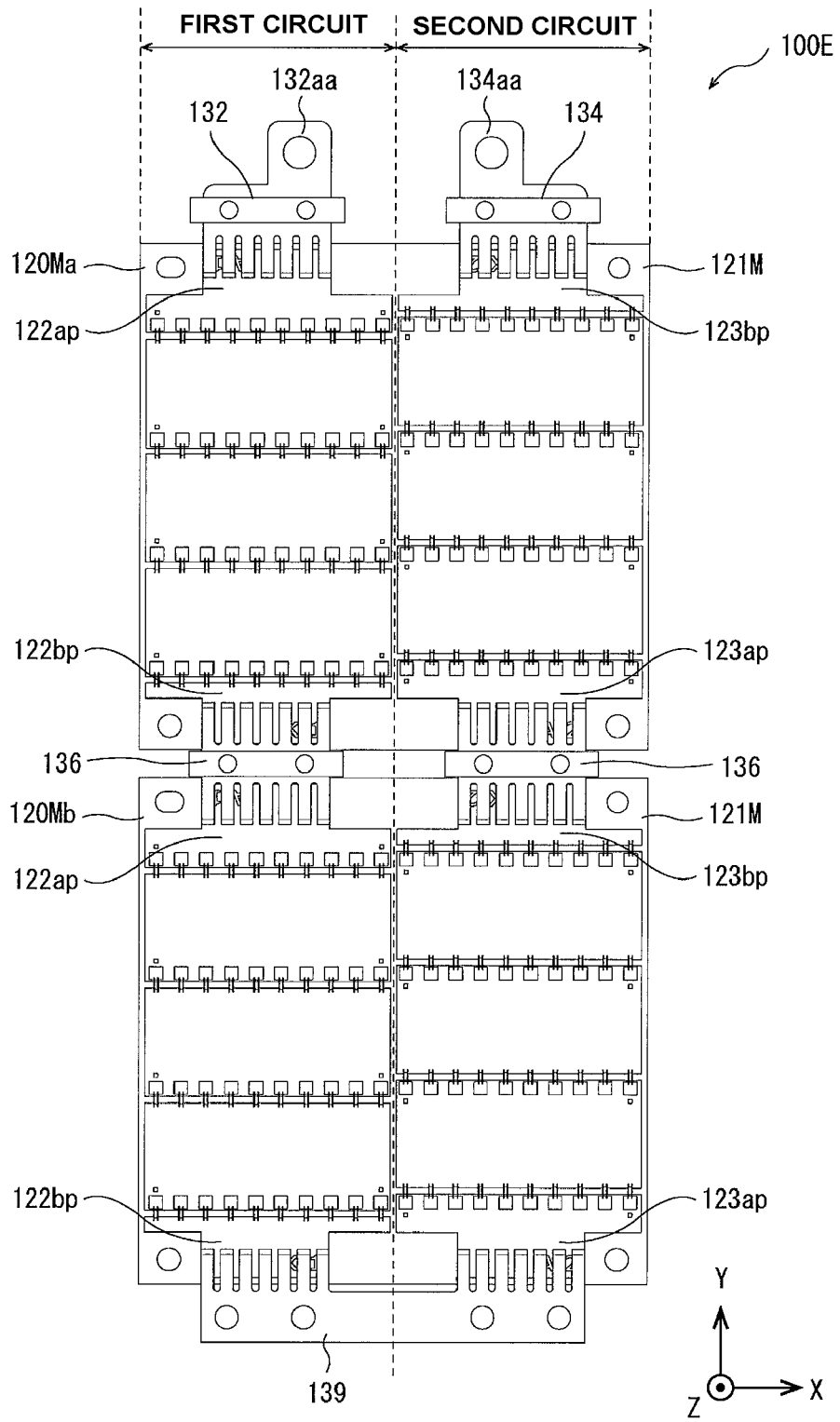
FIG. 14 is a diagram showing a fifth variation of a LED unit provided in a light illuminating apparatus according to an embodiment of the present disclosure.

FIG. 14 is a diagram showing a fifth variation of the LED unit 100 of this embodiment. A LED unit 100E of this variation is different from the LED unit 100D of the fourth variation in the respect that the LED unit 100E has the integrated end power supply terminal 139 instead of the end power supply terminal 132, 134 connected to the LED substrate module 120Mb. That is, in this variation, the end power supply terminal 139 is installed between the terminal area 122bp and the terminal area 123ap of the LED substrate module 120Mb. By this construction, the first circuit and the second circuit are successive, forming a series circuit in the LED unit 100E, in the same way as the first variation and the second variation.

(Sixth Variation)

Figure 15:
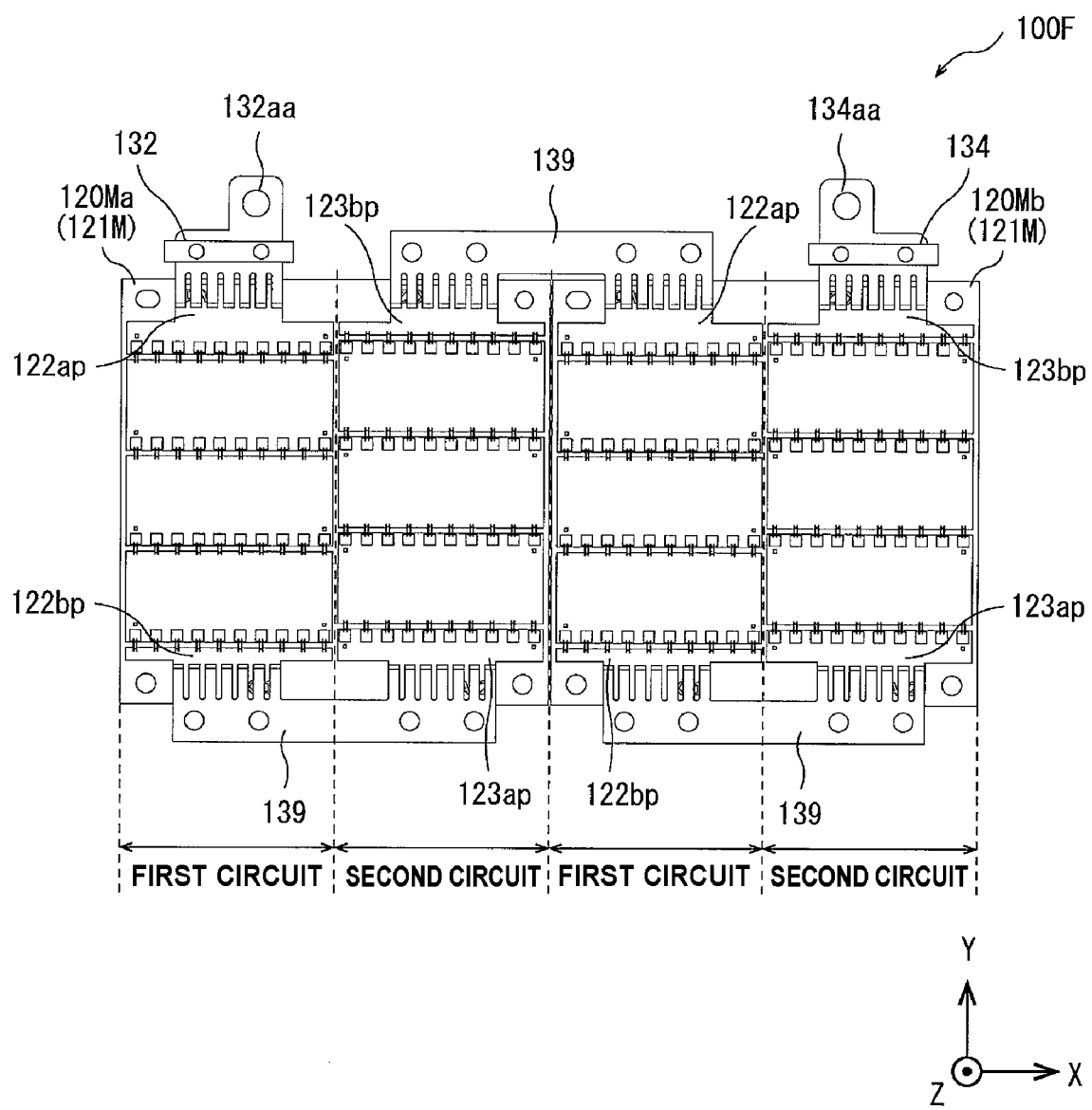
FIG. 15 is a diagram showing a sixth variation of a LED unit provided in a light illuminating apparatus according to an embodiment of the present disclosure.

FIG. 15 is a diagram showing a sixth variation of the LED unit 100 of this embodiment. A LED unit 100F of this variation is different from the LED unit 100E of the fifth variation in the respect that the LED unit 100F is configured such that the LED substrate modules 120Ma, 120Mb are arranged in X-axis direction, the first circuit and the second circuit of each LED substrate module 120Ma, 120Mb are connected by the end power supply terminal 139, and the second circuit of the LED substrate module 120Ma and the first circuit of the adjacent LED substrate module 120Mb are also connected by the end power supply terminal 139. That is, in this variation, the end power supply terminal 139 is installed between the terminal area 122bp and the terminal area 123ap of each LED substrate module 120Ma, 120Mb, and between the terminal area 123bp of the LED substrate module 120Ma and the terminal area 122ap of the LED substrate module 120Mb. By this construction, the dimension in Y-axis direction can be restrained.

(Seventh Variation)

Figure 16:
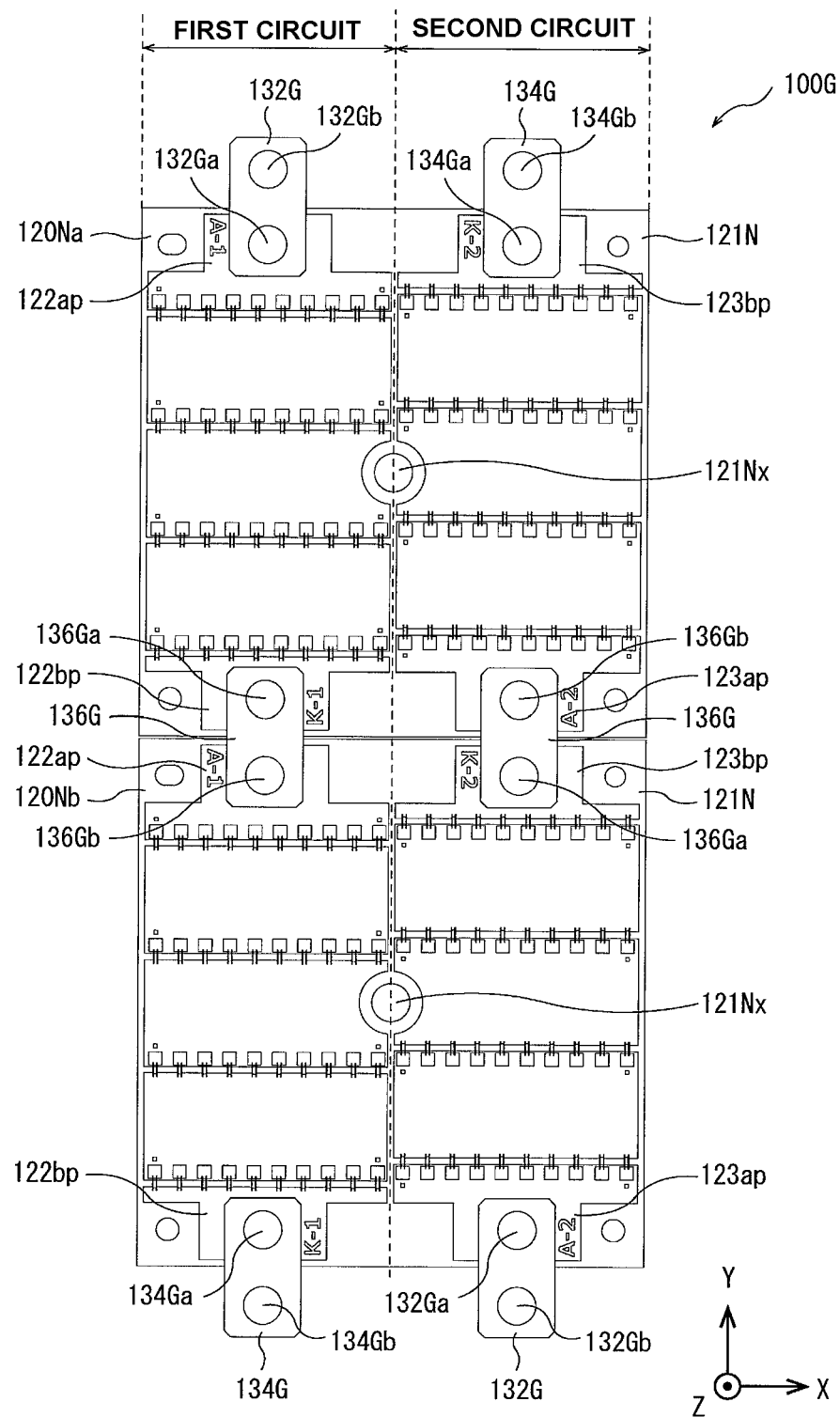
FIG. 16 is a diagram showing a seventh variation of a LED unit provided in a light illuminating apparatus according to an embodiment of the present disclosure.
Figure 17:
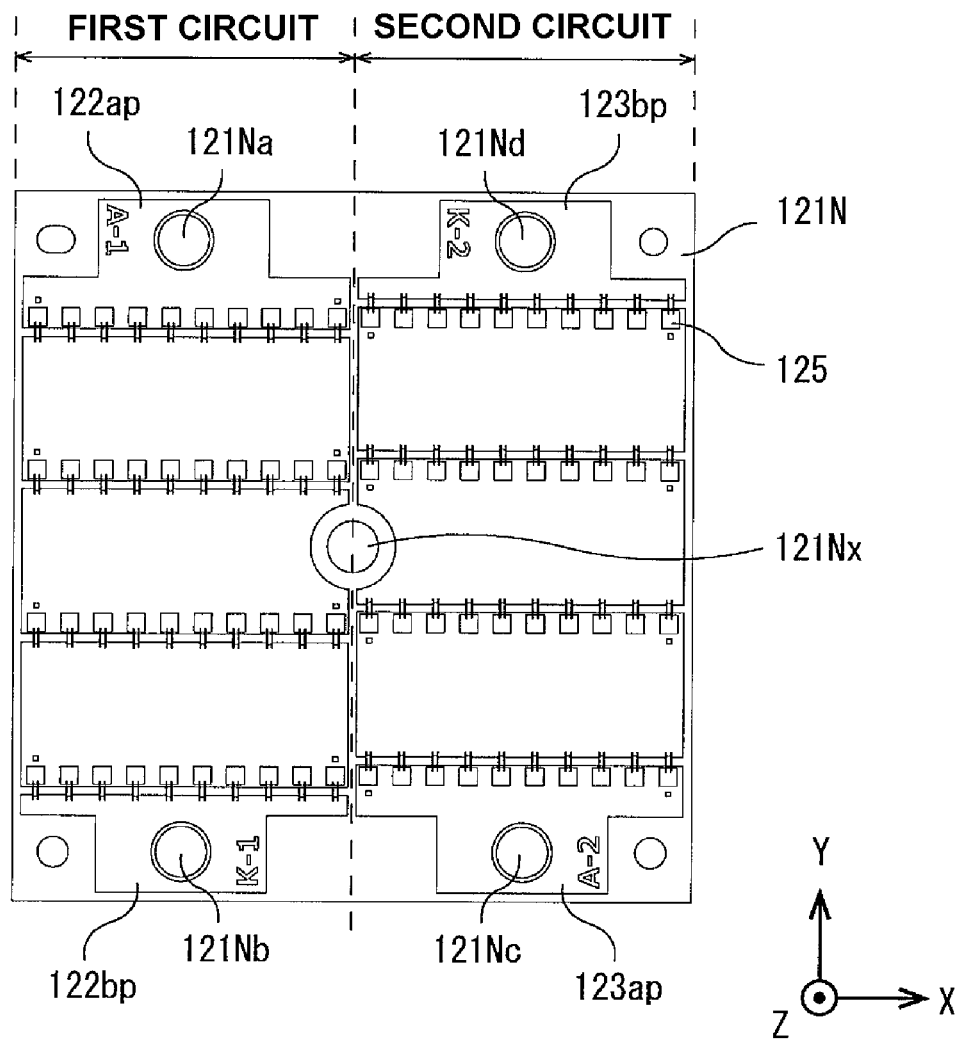
FIG. 17 is a diagram showing a seventh variation of a LED unit provided in a light illuminating apparatus according to an embodiment of the present disclosure.

FIGS. 16 and 17 are diagrams showing a seventh variation of the LED unit 100 of this embodiment. A LED unit 100G of this variation is different from the LED unit 100D of the fourth variation in the respect that the LED unit 100G has a substrate 121N shown in FIG. 17 mounted thereon, and an end power supply terminal 132G, 134G and an intermediate power supply terminal 136G instead of the end power supply terminal 132, 134 and the intermediate power supply terminal 136. The substrate 121N of this variation is different from the substrate 121M of the fourth variation (FIG. 13) in the respect that the substrate 121N has a through-hole 121Nx into which a screw (not shown) for fixing the substrate 121N is inserted, passing therethrough, at the rough center of the substrate 121N, and through-holes 121Na, 121Nb, 121Nc, 121Nd for fixing the end power supply terminal 132G, 134G or the intermediate power supply terminal 136G at the terminal areas 122ap, 122bp, 123ap, 123bp.

The end power supply terminal 132G is a thin plate-shaped member of metal (for example, copper) to supply power to LED substrate modules 120Na, 120Nb.

The end power supply terminal 132G has a through-hole 132Ga for fixing to the substrate 121N and a through-hole 132Gb for fixing to the anode terminal not shown. In this variation, the end power supply terminal 132G is attached to the terminal area 122ap of the LED substrate module 120Na and the terminal area 123ap of the LED substrate module 120Nb, and is each fixed by a screw (not shown) passing through the through-hole 132Ga and the through-hole 121Na of the LED substrate module 120Na (FIG. 17) and a screw (not shown) passing through the through-hole 132Ga and the through-hole 121Nc of the LED substrate module 120Nb (FIG. 17). Furthermore, each end power supply terminal 132G is fixed to the anode terminal (not shown) by a screw (not shown) passing through the through-hole 132Gb.

Similar to the end power supply terminal 132G, the end power supply terminal 134G is a thin plate-shaped member of metal (for example, copper) to supply power to the LED substrate module 120Na, 120Nb. The end power supply terminal 134G has a through-hole 134Ga for fixing to the substrate 121N and a through-hole 134Gb for fixing to the cathode terminal not shown. In this variation, the end power supply terminal 134G is attached to the terminal area 123bp of the LED substrate module 120Na and the terminal area 122bp of the LED substrate module 120Nb, and is each fixed by a screw (not shown) passing through the through-hole 134Ga and the through-hole 121Nd of the LED substrate module 120Na (FIG. 17) and a screw (not shown) passing through the through-hole 134Ga and the through-hole 121Nb of the LED substrate module 120Nb (FIG. 17). Furthermore, each end power supply terminal 134G is fixed to the cathode terminal (not shown) by a screw (not shown) passing through the through-hole 134Gb.

The intermediate power supply terminal 136G is a thin plate-shaped member of metal (for example, copper) respectively connecting the first circuit and the second circuit of the LED substrate module 120Na, 120Nb in series. The intermediate power supply terminal 136G has through-holes 136Ga, 136Gb for fixing to the substrate 121N. In this variation, the intermediate power supply terminal 136G is attached between the terminal area 122bp of the LED substrate module 120Na and the terminal area 122ap of the LED substrate module 120Nb, and between the terminal area 123ap of the LED substrate module 120Na and the terminal area 123bp of the LED substrate module 120Nb. The intermediate power supply terminal 136G placed between the terminal area 122bp of the LED substrate module 120Na and the terminal area 122ap of the LED substrate module 120Nb is fixed by a screw (not shown) passing through the through-hole 136Ga and the through-hole 121Nb of the LED substrate module 120Na (FIG. 17) and a screw (not shown) passing through the through-hole 136Gb and the through-hole 121Na of the LED substrate module 120Nb (FIG. 17). Furthermore, the intermediate power supply terminal 136G placed between the terminal area 123ap of the LED substrate module 120Na and the terminal area 123bp of the LED substrate module 120Nb is fixed by a screw (not shown) passing through the through-hole 136Ga and the through-hole 121Nd of the LED substrate module 120Nb (FIG. 17) and a screw (not shown) passing through the through-hole 136Gb and the through-hole 121Nc of the LED substrate module 120Na (FIG. 17).

As above, in this variation, the end power supply terminal 132G, 134G and the intermediate power supply terminal 136G are directly fixed to the LED substrate module 120Na, 120Nb. Furthermore, in this variation, dissimilar to the LED unit 100D of the fourth variation, because it is impossible to press the LED substrate modules 120Na and 120Nb by the end power supply terminal 132G, 134G and the intermediate power supply terminal 136G, a screw not shown is allowed to be inserted into and pass through the through-hole 121Nx to fix each of the LED substrate modules 120Na and 120Nb. By the construction of this variation, it is possible to firmly fix the LED substrate modules 120Na and 120Nb by a screw. Accordingly, it is possible to bring the substrate 121N and the base plate 110 into close contact no matter how large the substrate 121 N is, thereby reducing the thermal resistance between the substrate 121N and the base plate 110. Furthermore, it is possible to reduce manufacturing costs as compared to the construction using one large-area substrate.

(Eighth Variation)

Figure 18:
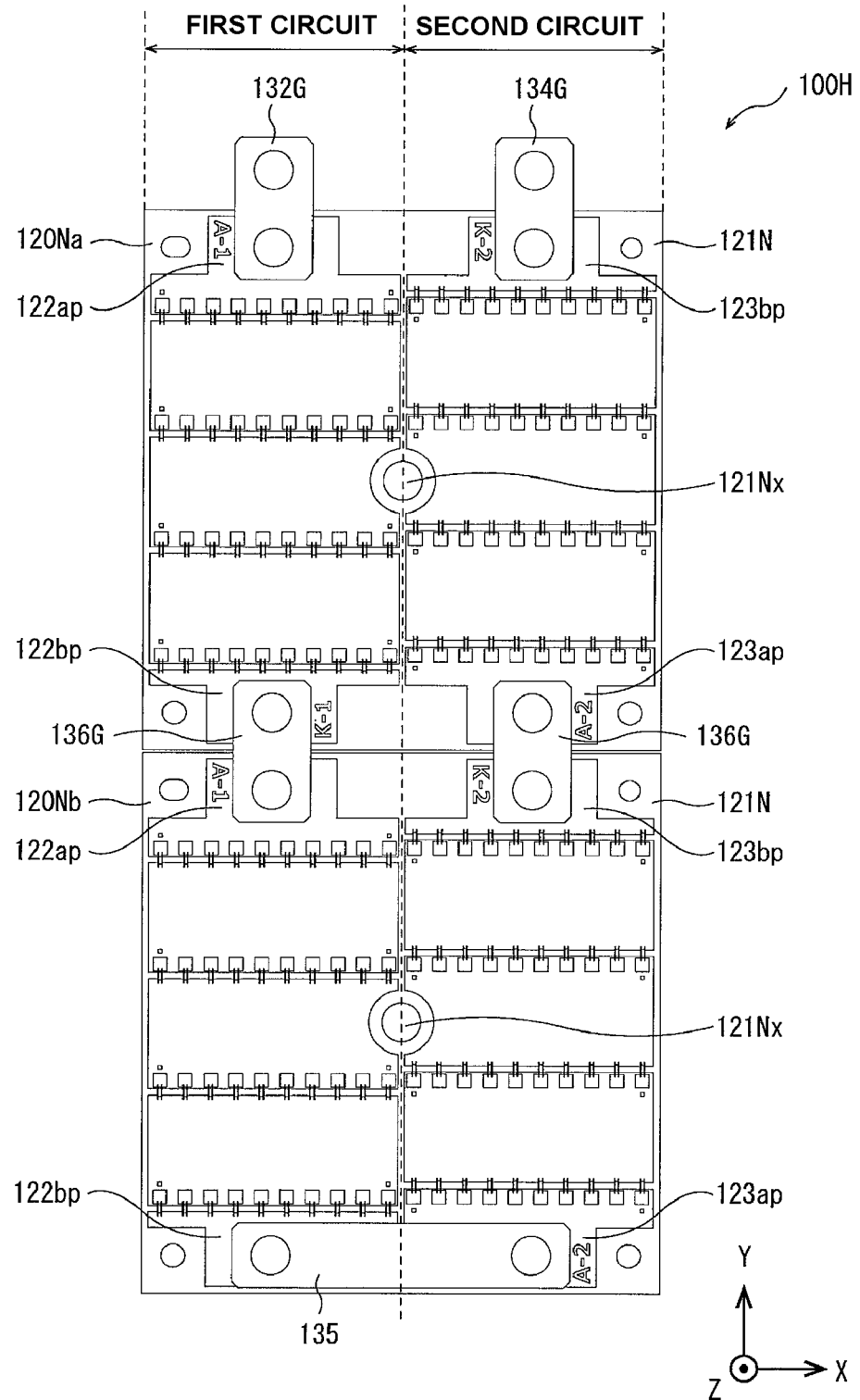
FIG. 18 is a diagram showing an eighth variation of a LED unit provided in a light illuminating apparatus according to an embodiment of the present disclosure.

FIG. 18 is a diagram showing an eighth variation of the LED unit 100 of this embodiment. A LED unit 100H of this variation is different from the LED unit 100G of the seventh variation in the respect that the LED unit 100H uses the end power supply terminal 135 connecting the terminal area 122bp and the terminal area 123ap of the LED substrate module 120Nb, instead of the end power supply terminal 132G, 134G connected to the terminal areas 122bp and 123a of the LED substrate module 120Nb. By the construction of this variation, the first circuit and the second circuit are successive, forming a series circuit in the LED unit 100H, in the same way as the first variation and the second variation.

(Ninth Variation)

Figure 19:
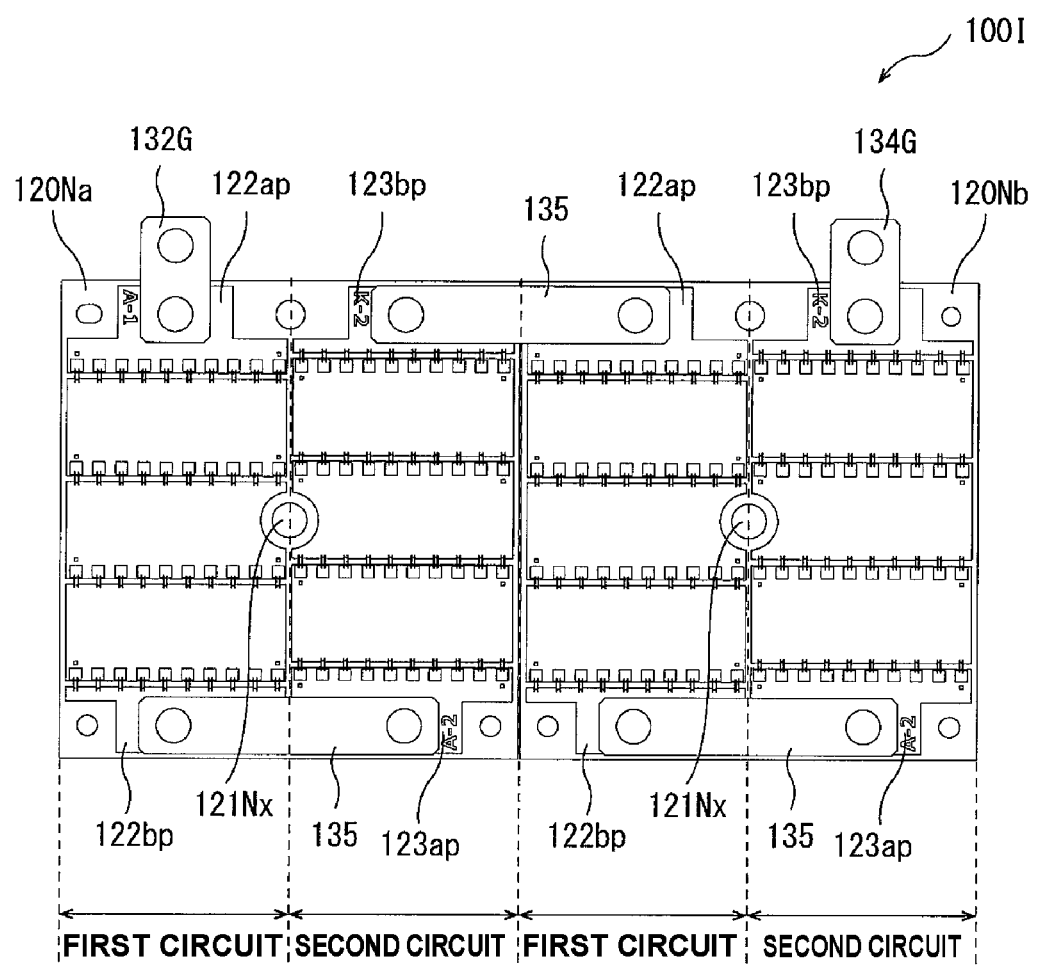
FIG. 19 is a diagram showing a ninth variation of a LED unit provided in a light illuminating apparatus according to an embodiment of the present disclosure.

FIG. 19 is a diagram showing a ninth variation of the LED unit 100 of this embodiment. A LED unit 100I of this variation is different from the LED unit 100H of the eighth variation in the respect that the LED substrate modules 120Na, 120Nb are arranged in X-axis direction, the first circuit and the second circuit of each LED substrate module 120Na, 120Nb are connected by the end power supply terminal 135, and the second circuit of the LED substrate module 120Na and the first circuit of the adjacent LED substrate module 120Nb are also connected by the end power supply terminal 135. That is, in this variation, the end power supply terminal 135 is installed between the terminal area 122bp and the terminal area 123ap of each LED substrate module 120Na, 120Nb, and between the terminal area 123bp of the LED substrate module 120Na and the terminal area 122ap of the LED substrate module 120Nb. By this construction, the dimension in Y-axis direction can be restrained.

Furthermore, it should be understood that the disclosed experiments are illustrative in all aspects and are not limitative. The scope of the present disclosure is defined by the appended claims rather than the foregoing description, and encompasses all changes within the meaning and scope of equivalents to the claims.

The invention claimed is:

1. A light emitting diode (LED) substrate, comprising:
   a substrate of a rectangular shape having sides in a first direction and a second direction perpendicular to the first direction;
   2n circuits arranged in the first direction, n being an integer greater than or equal to 1, each circuit of the 2n circuits including:
   a plurality of LED devices placed on a surface of the substrate,
   a plurality of conducting members which electrically connect the plurality of LED devices on the surface of the substrate,
   a first electrode on a conducting member of the plurality of conducting members to receive an input electric current to said each circuit, and
   a second electrode on another conducting member of the plurality of conducting members to output an output electric current from said each circuit,
   wherein
   the first electrode and the second electrode face each other in the second direction, and
   in the second direction, the plurality of LED devices are between the first electrode and the conducting member, and the other conducting member and the second electrode, and
   in a pair of the 2n circuits adjacent to each other in the first direction, the first electrode in one circuit of the adjacent pair of the 2n circuits, and the first electrode in another circuit of the adjacent pair of the 2n circuits, are point-symmetrical with respect to a point between the adjacent pair of the 2n circuits, and the second electrode in the one circuit of the adjacent pair of the 2n circuits, and the second electrode in the other circuit of the adjacent pair of the 2n circuits, are point-symmetrical with respect to the point between the adjacent pair of the 2n circuits.

2. The LED substrate according to claim 1, wherein said each circuit of the 2n circuits comprises a parallel circuit in which some of the plurality of LED devices are connected in parallel.

3. The LED substrate according to claim 2, wherein the plurality of LED devices is placed in a line shape along the first direction.

4. The LED substrate according to claim 1, wherein said each circuit of the 2n circuits comprises a plurality of parallel circuits in which some of the plurality of LED devices are connected in parallel, and a series circuit in which the plurality of parallel circuits is connected in series.

5. The LED substrate according to claim 4, wherein the plurality of LED devices is placed in multi-line shape along the first direction.

6. A light illuminating apparatus comprising at least one of the LED substrate as defined in claim 1.

7. The light illuminating apparatus according to claim 6, comprising M of the LED substrate as defined in claim 1, wherein M is an integer greater than or equal to 2, the M of the LED substrate being arranged in the second direction, and when $1^{st}$ to $M^{th}$ LED substrates of the M of the LED substrate are set in a sequential order along the second direction, and $1^{st}$ to $2n^{th}$ circuits of the 2n circuits are set in a sequential order along the first direction, the light illuminating apparatus comprises:

a connecting member placed between and electrically connecting the second electrode of an $i^{th}$ LED substrate of the $1^{st}$ to $M^{th}$ LED substrates and the first electrode of an i+$1^{th}$ LED substrate of the $1^{st}$ to $M^{th}$ LED substrates, wherein i is an integer greater than or equal to 1 and less than or equal to M−1;

a first power supply member connected to the first electrode of a 2j-$1^{th}$ circuit of the 2n circuits formed in the $1^{st}$ LED substrate, and another first power supply member connected to the first electrode of a $2j^{th}$ circuit of the 2n circuits formed in the $M^{th}$ LED substrate to supply the input electric current, wherein j is an integer greater than or equal to 1 and less than or equal to n; and a second power supply member connected to the second electrode of a 2j-$1^{th}$ circuit of the 2n circuits formed in the $M^{th}$ LED substrate, and another second power supply member connected to the second electrode of a $2j^{th}$ circuit of the 2n circuits formed in the $1^{st}$ LED substrate to output the output electric current from the second electrode.

8. The light illuminating apparatus according to claim 6, comprising M of the LED substrate as defined in claim 1, wherein M is an integer greater than or equal to 2, the M of the LED substrate being arranged in the second direction, and when $1^{st}$ to $M^{th}$ LED substrates of the M of the LED substrate are set in a sequential order along the second direction, and $1^{st}$ to $2n^{th}$ circuits of the 2n circuits are set in a sequential order along the first direction, the light illuminating apparatus comprises:

a first connecting member placed between and electrically connecting the second electrode of an $i^{th}$ LED substrate of the $1^{st}$ to $M^{th}$ LED substrates and the first electrode of an i+$1^{th}$ LED substrate of the $1^{st}$ to $M^{th}$ LED substrates, wherein i is an integer greater than or equal to 1 and less than or equal to M−1;

a second connecting member placed between the second electrode of a 2j-$1^{th}$ circuit of the 2n circuits and the first electrode of a $2j^{th}$ circuit of the 2n circuits formed in the $M^{th}$ LED substrate to electrically connect them, wherein j is an integer greater than or equal to 1 and less than or equal to n;

a first power supply member connected to the first electrode of a 2j-$1^{th}$ circuit of the 2n circuits formed in the $1^{5t}$ LED substrate to supply the input electric current to the first electrode; and a second power supply member connected to the second electrode of a $2j^{th}$ circuit of the 2n circuits formed in the $1^{st}$ LED substrate to output the output electric current from the second electrode.

9. The light illuminating apparatus according to claim 8, wherein the first connecting member, the second connecting member, the first power supply member, and the second power supply member serve as a fixing part for fixing the LED substrate.

10. A light illuminating apparatus comprising at least one of the LED substrate as defined in claim 2.

11. A light illuminating apparatus comprising at least one of the LED substrate as defined in claim 3.

12. A light illuminating apparatus comprising at least one of the LED substrate as defined in claim 4.

13. A light illuminating apparatus comprising at least one of the LED substrate as defined in claim 5.

14. The light illuminating apparatus according to claim 10, comprising M of the LED substrate as defined in claim 1, wherein M is an integer greater than or equal to 2, the M of the LED substrate being arranged in the second direction, and when $1^{st}$ to $M^{th}$ LED substrates of the M of the LED substrate are set in a sequential order along the second direction, and $1^{st}$ to $2n^{th}$ circuits of the 2n circuits are set in a sequential order along the first direction, the light illuminating apparatus comprises:

a connecting member placed between and electrically connecting the second electrode of an $i^{th}$ LED substrate of the $1^{st}$ to $M^{th}$ LED substrates and the first electrode of an i+$1^{th}$ LED substrate of the $1^{st}$ to $M^{th}$ LED substrates, wherein i is an integer greater than or equal to 1 and less than or equal to M−1;

a first power supply member connected to the first electrode of a 2j-$1^{th}$ circuit of the 2n circuits formed in the $1^{st}$ LED substrate and a $2j^{th}$ circuit of the 2n circuits formed in the $M^{th}$ LED substrate to supply the input electric current to the first electrode, wherein j is an integer greater than or equal to 1 and less than or equal to n; and a second power supply member connected to the second electrode of a 2j-$1^{th}$ circuit of the 2n circuits formed in the $M^{th}$ LED substrate and a $2j^{th}$ circuit of the 2n circuits formed in the $1^{st}$ LED substrate to output the output electric current from the second electrode.

15. The light illuminating apparatus according to claim 11, comprising M of the LED substrate as defined in claim 1, wherein M is an integer greater than or equal to 2, the M of the LED substrate being arranged in the second direction, and when $1^{st}$ to $M^{th}$ LED substrates of the M of the LED substrate are set in a sequential order along the second direction, and $1^{st}$ to $2n^{th}$ circuits of the 2n circuits are set in a sequential order along the first direction, the light illuminating apparatus comprises:

a connecting member placed between and electrically connecting the second electrode of an $i^{th}$ LED substrate of the $1^{st}$ to $M^{th}$ LED substrates and the first electrode of an $i+1^{th}$ LED substrate of the $1^{st}$ to $M^{th}$ LED substrates, wherein i is an integer greater than or equal to 1 and less than or equal to M−1;

a first power supply member connected to the first electrode of a $2j-1^{th}$ circuit of the 2n circuits formed in the $1^{st}$ LED substrate and a $2j^{th}$ circuit of the 2n circuits formed in the $M^{th}$ LED substrate to supply the input electric current to the first electrode, wherein j is an integer greater than or equal to 1 and less than or equal to n; and a second power supply member connected to the second electrode of a $2j-1^{th}$ circuit of the 2n circuits formed in the $M^{th}$ LED substrate and a $2j^{th}$ circuit of the 2n circuits formed in the $1^{st}$ LED substrate to output the output electric current from the second electrode.

16. The light illuminating apparatus according to claim 12, comprising M of the LED substrate as defined in claim 1, wherein M is an integer greater than or equal to 2, the M of the LED substrate being arranged in the second direction, and when $1^{st}$ to $M^{th}$ LED substrates of the M of the LED substrate are set in a sequential order along the second direction, and $1^{st}$ to $2n^{th}$ circuits of the 2n circuits are set in a sequential order along the first direction, the light illuminating apparatus comprises:

a connecting member placed between and electrically connecting the second electrode of an $i^{th}$ LED substrate of the $1^{st}$ to $M^{th}$ LED substrates and the first electrode of an $i+1^{th}$ LED substrate $1^{st}$ to $M^{th}$ LED substrates, wherein i is an integer greater than or equal to 1 and less than or equal to M−1;

a first power supply member connected to the first electrode of a $2j-1^{th}$ circuit of the 2n circuits formed in the $1^{st}$ LED substrate and a $2j^{th}$ circuit of the 2n circuits formed in the $M^{th}$ LED substrate to supply the input electric current to the first electrode, wherein j is an integer greater than or equal to 1 and less than or equal to n; and a second power supply member connected to the second electrode of a $2j-1^{th}$ circuit of the 2n circuits formed in the $M^{th}$ LED substrate and a $2j^{th}$ circuit of the 2n circuits formed in the $1^{st}$ LED substrate to output the output electric current from the second electrode.

17. The light illuminating apparatus according to claim 13, comprising M of the LED substrate as defined in claim 1, wherein M is an integer greater than or equal to 2, the M of the LED substrate being arranged in the second direction, and when $1^{st}$ to $M^{th}$ LED substrates of the M of the LED substrate are set in a sequential order along the second direction, and $1^{st}$ to $2n^{th}$ circuits of the 2n circuits are set in a sequential order along the first direction, the light illuminating apparatus comprises:

a connecting member placed between and electrically connecting the second electrode of an $i^{th}$ LED substrate of the $1^{st}$ to $M^{th}$ LED substrates and the first electrode of an $i+1^{th}$ LED substrate of the $1^{st}$ to $M^{th}$ LED substrates, wherein i is an integer greater than or equal to 1 and less than or equal to M−1;

a first power supply member connected to the first electrode of a $2j-1^{th}$ circuit of the 2n circuits formed in the $1^{st}$ LED substrate and a $2j^{th}$ circuit of the 2n circuits formed in the $M^{th}$ LED substrate to supply the input electric current to the first electrode, wherein j is an integer greater than or equal to 1 and less than or equal to n; and a second power supply member connected to the second electrode of a $2j-1^{th}$ circuit of the 2n circuits formed in the $M^{th}$ LED substrate and a $2j^{th}$ circuit of the 2n circuits formed in the $1^{st}$ LED substrate to output the output electric current from the second electrode.

18. The light illuminating apparatus according to claim 7, wherein the connecting member, the first power supply member, and the second power supply member serve as a fixing part for fixing the LED substrate.

* * * * *